(12) United States Patent
Macias

(10) Patent No.: US 6,297,667 B1
(45) Date of Patent: Oct. 2, 2001

(54) CIRCUITS AND SEQUENCES FOR ENABLING REMOTE ACCESS TO AND CONTROL OF NON-ADJACENT CELLS IN A LOCALLY SELF-RECONFIGURABLE PROCESSING SYSTEM COMPOSED OF SELF-DUAL PROCESSING CELLS

(76) Inventor: Nicholas J. Macias, P.O. Box 510485, Salt Lake City, UT (US) 84151

( * ) Notice: Subject to any disclaimer, the term of this patent is extended or adjusted under 35 U.S.C. 154(b) by 0 days.

(21) Appl. No.: 09/702,574

(22) Filed: Oct. 31, 2000

(51) Int. Cl.[7] .................................. H03K 19/177
(52) U.S. Cl. ................................ 326/41; 326/38
(58) Field of Search ........................... 326/37–41

(56) References Cited

U.S. PATENT DOCUMENTS

| | | | |
|---|---|---|---|
| 5,883,525 | * | 3/1999 | Tavana et al. ................ 326/41 |
| 6,054,871 | * | 4/2000 | New ............................. 326/41 |
| 6,222,381 | * | 4/2001 | Durbeck et al. ............... 326/41 |
| 6,255,849 | * | 7/2001 | Mohan .......................... 326/41 |

* cited by examiner

Primary Examiner—Michael Tokar
Assistant Examiner—Don Phu Le

(57) ABSTRACT

Particular configurations of collections of cells within a locally self-reconfigurable processing system to allow remote configuration operations to be performed from within the system. The behavior of these configurations, and how they enable remote access to and control of non-adjacent cells is described. Also disclosed are particular configurations which can be used to create copies of themselves, thereby extending their area of control. Sequences of configuration steps which use, build, modify and extend the disclosed configurations are also described, including particular sequences useful for building large-scale circuits within the system.

33 Claims, 38 Drawing Sheets

1: CC=1
PC=

2: CC=0
PC=

3: CC=1
PC=

4: CC=0
PC=

5: CC=1
PC=

6: CC=0
PC=

1: CC=1

PC=

2: CC=0

PC=

3: CC=1

PC=

4: CC=0

PC=

5: CC=1

PC=

6: CC=0

PC=

7: CC=1

PC=

8: CC=0

PC=

CIRCUITS AND SEQUENCES FOR ENABLING REMOTE ACCESS TO AND CONTROL OF NON-ADJACENT CELLS IN A LOCALLY SELF-RECONFIGURABLE PROCESSING SYSTEM COMPOSED OF SELF-DUAL PROCESSING CELLS

BACKGROUND OF THE INVENTION

The present invention relates to the field of cell-based parallel processing systems composed of a regular collection of processing cells whose behavior is controlled by software contained within each cell. In particular, it relates to a processing system called the Cell Matrix (U.S. Pat. No. 5,886,537 (Macias, et al.)) composed of self-dual processing cells which each operate in one of two modes, one mode being a data processing mode, and the other being a code processing mode. More particularly, it relates to configurations of such cells to enable non-adjacent cells to interact with each other as if they were adjacent.

Self-dual processing cells are programmable logic devices which can interchangeably process both data and code. Such cells are self-dual in that they are able to both configure other cells and be configured by other cells. Collections of self-dual cells can be assembled into a self-reconfigurable system, called a cell matrix. U.S. Pat. No. 5,886,537 discusses in detail such self-dual processors as well as their assembly into a processing matrix.

Devices such as field programmable gate arrays (FPGAs) and programmable logic devices (PLDs) generally employ mechanisms to allow their programmable blocks to interact with each other despite their possibly non-adjacent locations. For example, U.S. Pat. No. 5,212,652 (Agrawal, et al.) describes an interconnect system to allow flexible connection among the device's logic blocks, including connections between blocks on opposite sides of the device.

In contrast, the cells within a cell matrix interact only with nearby cells which are adjacent according to a fixed, predefined system topology. This simple interaction scheme has several advantages over more sophisticated routing systems.

Since both data and configuration information are exchanged only among small sets of neighbors, there is no need for system-wide address and data buses. Since the set of possible sources and destinations is limited to the number of adjacent cells, the size of each cell's address space is fixed, independent of the total number of cells in the system.

Hence a matrix of such cells is infinitely scalable, in that two such matrices can simply be attached along their boundaries, with adjacent boundary cells connected between the two matrices, to produce a larger matrix. This scalability has profound advantages in terms of manufacturing large cell matrices. This simple interconnection scheme also has tremendous benefits in terms of fault tolerance, since it eliminates most architecturally-critical failure points.

Additionally, the presence of local control at all points within the matrix allows reconfiguration tasks to be distributed throughout the matrix, allowing multiple configurations to be performed in parallel. This offers dramatic speedup potential of configuration tasks for extremely large matrices as compared to an externally-configured device.

It is therefore clear that the local-only interaction scheme of a cell matrix has definite advantages over a system with centralized control and global communications, such as an FPGA. However, these advantages come at a price. Because cells are only configurable by adjacent neighboring cells, there remains the question of how one set of cells can configure another set of non-adjacent remote cells. Since any cell has direct access to only a small, fixed number of adjacent neighboring cells, there is no direct way to configure collections of cells, i.e., there is no direct way to build useful circuits.

This is also a problem in trying to bootstrap an empty cell matrix. In a two-dimensional matrix, only cells which lie along an edge are directly accessible from outside the matrix. There is no way to access internal cells except via their neighbors, which may themselves be internal (non-edge) cells, and therefore only be accessible by their neighbors, and so on. There is thus no direct way for an external controller to configure internal cells within a cell matrix.

OBJECTS AND ADVANTAGES

Accordingly, several objects and advantages of the present invention are:

a) to provide a configuration of cells, called a wire, which allow one set of cells to configure a remote cell in a cell matrix;

b) to provide a configuration of cells, called an extendible wire, which operates as a wire but can also be extended by simply adding more cells to its end;

c) to provide sequences of configuration steps for extending an extendible wire;

d) to provide sequences of configuration steps for breaking an extendible wire and returning control to an earlier point in the wire; and e) to provide sequences of configuration steps for programming cells near but not adjacent to the end of a wire.

Further objects and advantages are to provide circuit configurations and sequences which can be used for building wires in a previously-configured region of a cell matrix. Still further objects and advantages will become apparent from a consideration of the ensuing description and drawings.

SUMMARY

The present invention allows one to effectively use the cell matrix architecture (as described in U.S. Pat. No. 5,886,537), by allowing cells which normally interact only with immediate neighbors to additionally interact with non-adjacent cells in the matrix. This is achieved through a combination of particular cell configurations and sequences of configuration instructions which are sent into those configurations. As a result, a cell's control over neighboring cells can be extended to control the entire matrix, thereby allowing useful circuit configurations which themselves can assemble, analyze and reconfigure other circuits within the cell matrix.

Description and Operation—First Embodiment

Figure 1:
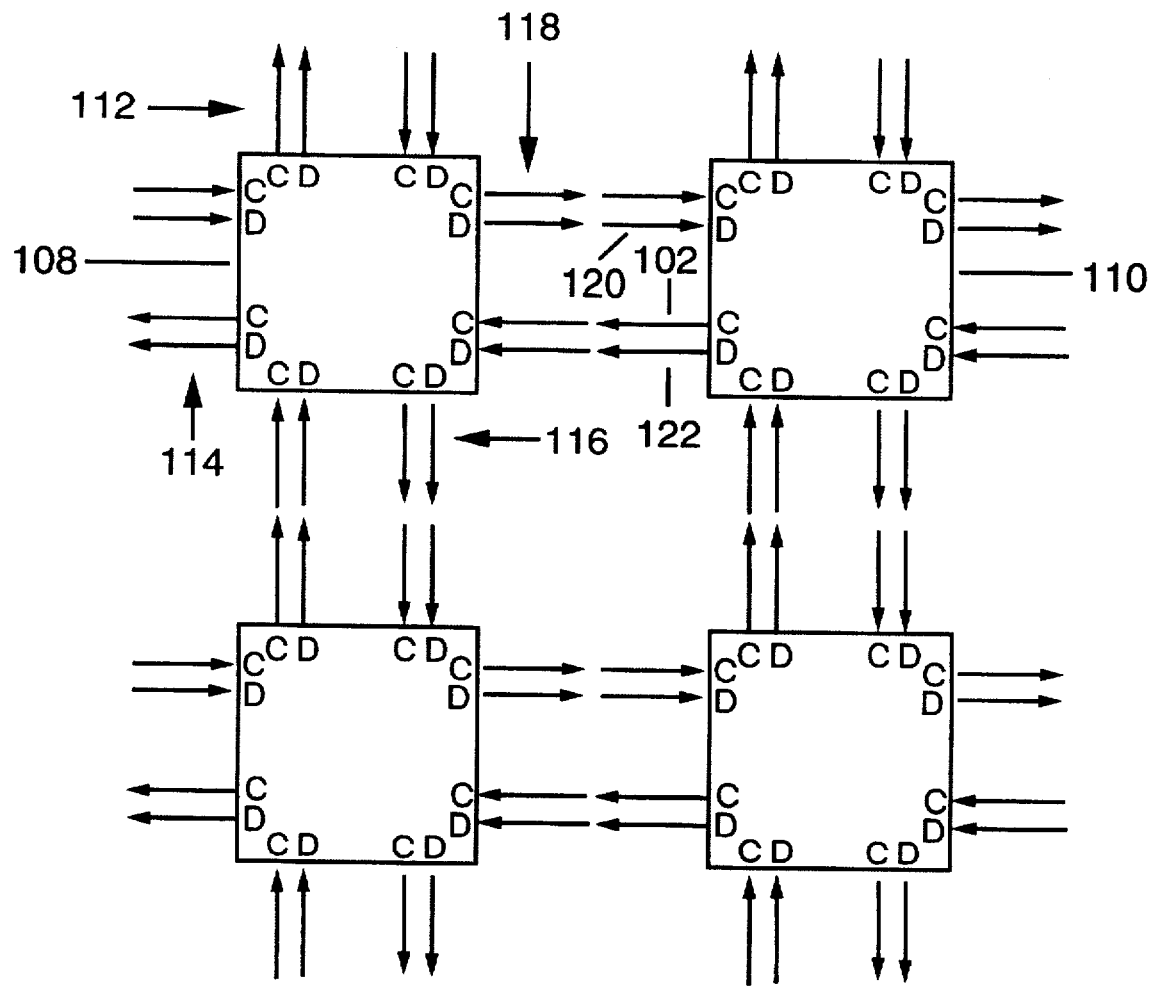
FIG. 1 illustrates a small 2×2 cell matrix with all inputs and outputs indicated.

Throughout this description, we will work with two-dimensional, four-sided cells. FIG. 1 shows a set of four such cells, arranged in a 2×2 matrix. As described in U.S. Pat. No. 5,886,537, each cell exchanges a single bit of information with each of its neighbors, via the "D" lines. This bit may, however, be interpreted in one of two ways, depending on which of two modes the cell is currently operating in: D-mode or C-mode.

If the cell is in D-mode, then the input bit is treated as data, and is processed by a program contained within the cell. This program consists of a truth table which maps inputs to outputs. The program's outputs are then presented on the cell's D outputs. In this way, a cell can operate as a combinational circuit which performs any desired input-to-output mapping. For example, a single cell can operate as a 1, 2, 3 or 4-input logic gate (AND, OR, XNOR, etc.), as a a2–1 multiplexer or selector, as a one-bit full adder, or as a routing resource.

If, instead, the cell is in C-mode, then the D input bit is treated as code, and becomes part of the cell's truth table. As each bit in the truth table is modified, the former bits are sent to the cell's D output.

The mode of a cell is controlled by its C inputs. If any of a cell's C inputs are 1, then the cell is in C-mode. Otherwise, the cell is in D-mode.

The interaction between C and D inputs can be used to configure and use cells to perform desired functions. For example, suppose one wishes a cell to operate as an AND gate. First the truth table corresponding to this function is determined (this is a fixed property of the cell matrix architecture). Next the target cell is placed in C-mode by asserting one of its C inputs. Next, on each tick of the system-wide clock, successive bits of the desired truth table are presented to the target cell's D input on the same side as the asserted C input. Each time the system clock ticks, the bit on the D input is loaded into the next location in the target cell's truth table configuration memory. After all bits have been loaded, the C input is returned to 0. This causes the target cell to return to D-mode, and it immediately begins processing inputs according to its new truth table.

We will use the term "programming period" to describe the number of clock ticks required to achieve a desired configuration of a cell. In general this will depend on the size of the configuration memory within each cell, which is a function of the underlying cell matrix architecture. More particularly, the number of ticks of the system clock which make up a programming period may depend on the particular configuration data being loaded. These details are irrelevant in what follows, as we will speak in terms of a programming period rather than a specific number of ticks of the system clock.

There are additional details to a cell's C- and D-modes of operation. When a cell is in D-mode, all of its outputs are generated according to its internal truth table memory. However, when a cell is in C-mode, all of its outputs are set to 0, except for D outputs on any side where a C input is 1. On those sides, the D outputs correspond to the previously-loaded truth table memory's values.

U.S. Pat. No. 5,886,537 explains the basic cell configuration operation in more detail. However, the specifics of cell configuration are unimportant in what follows. We will describe truth tables no in terms of the bits that make them up, but in terms of the truth table's functional behavior. Thus, we will talk about a truth table corresponding to equations like "DN=S" or "DE=(Not W) Or E." When we talk about sending such a truth table to a cell's D input, it is to be understood that what is being sent is a stream of bits, synchronized to the system-wide clock, and corresponding to the indicated truth table. While this correspondence depends on the particular implementation of the cell matrix architecture, it is irrelevant for the circuits and sequences which will be described herein.

When cells are interconnected as in FIG. 1, then each cell's outputs are a neighboring cell's inputs the cell has a neighbor on that side). Thus, in FIG. 1, line 102 is an output from cell 110, as well as an input to cell 108.

We will refer to the sides of a cell using compass directions. Thus lines 112 are the northern lines of cell 108, 114 are the western lines, 116 the southern, and 118 the eastern. Note that, effectively, 118 are also the western lines of cell 110.

Given this behavior of cells, any cell has full control over its neighboring cells. For example, cell 110 is able to read and write cell 108's truth table by asserting line 102 (cell 108's CW input), and then reading and writing lines 120 and 122 respectively. If cell 108 then de-asserts line 102 then cell 108 returns to D-mode (assuming none of its other C inputs are asserted), and begins executing its new truth table.

In FIG. 1, as in all other figures showing one or more cells, the cells are assumed to be part of a larger cell matrix. In general, if a cell is configured with all 0s in its truth table, i.e., if it is sending 0 to all of its outputs, we may suppress the drawing of such a cell in the figure.

Figure 2:
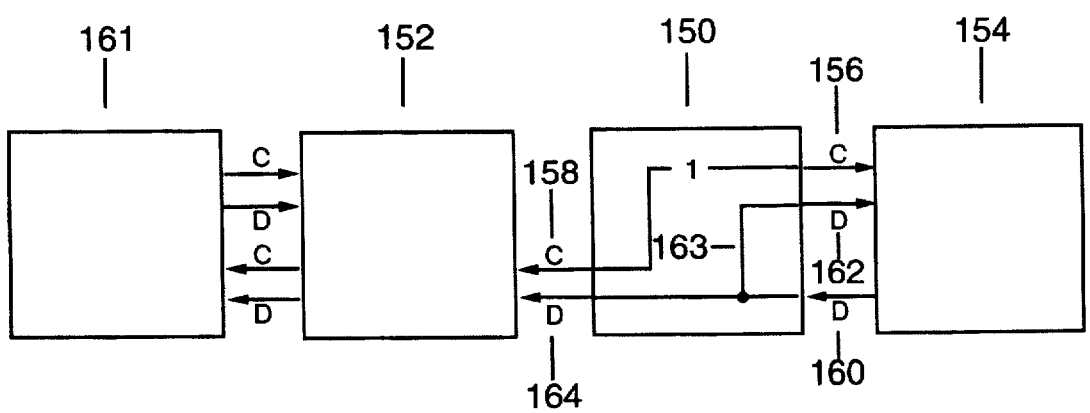
FIG. 2 illustrates one cell copying an adjacent source cell to an adjacent target cell.

Since any cell can both read and write programs from neighboring cells, it is possible for a cell to read one neighbor's truth table and copy it to another neighbor. FIG. 2 illustrates one way this could be done. D and C lines which are not used have been suppressed in this and all subsequent figures. Cell replicator 150 is configured to copy the contents of source cell 154's truth table memory into target cell 152's truth table memory. To accomplish this, cell replicator 150 asserts CE out line 156, which places source cell 154 in C-mode. Cell replicator 150 also asserts CW out line 158, which places target cell 152 in C-mode. Source cell 154 will send its current truth table out its DW out line 160. Cell replicator 150 sends this line back to cell 154's DW input 162, causing cell 154's truth table to be re-written as it is read.

In FIG. 2, the configuration of each cell is indicated schematically. For example, line 163 in cell 150 indicates that that cell's DE input is connected to its DE output. Such schematic information will be used in all subsequent figures. In such schematics, in additional to not drawing cells which are not involved in the operation of the circuit, we will also not draw inputs or outputs which are not used, nor will we draw outputs which are outputting 0.

Additionally, cell replicator 150 copies the source cell's truth table to DW out line 164. This causes target cell 152's truth table to be loaded with the same bits as in source cell 154's truth table. After all bits have been transferred, target cell 152 has the same truth table as source cell 154, and therefore will perform the same logical functions. Cell replicator 154 has effectively copied source cell 154 to target cell 152.

Such a copy procedure is fully described in UP Patent No. 5,886,537. However, there is a significant problem with this scheme. Namely, since cell replicator 150 requires access to both the C and D lines of the source and target cells, the source and target cells must be adjacent to the cell replicator. So, for example, there is no direct way for cell replicator 150 to modify cell 161's truth table. Because of this, the circuit configuration shown in FIG. 2, while theoretically interesting, is of limited usefulness for building large circuits.

Figure 3:
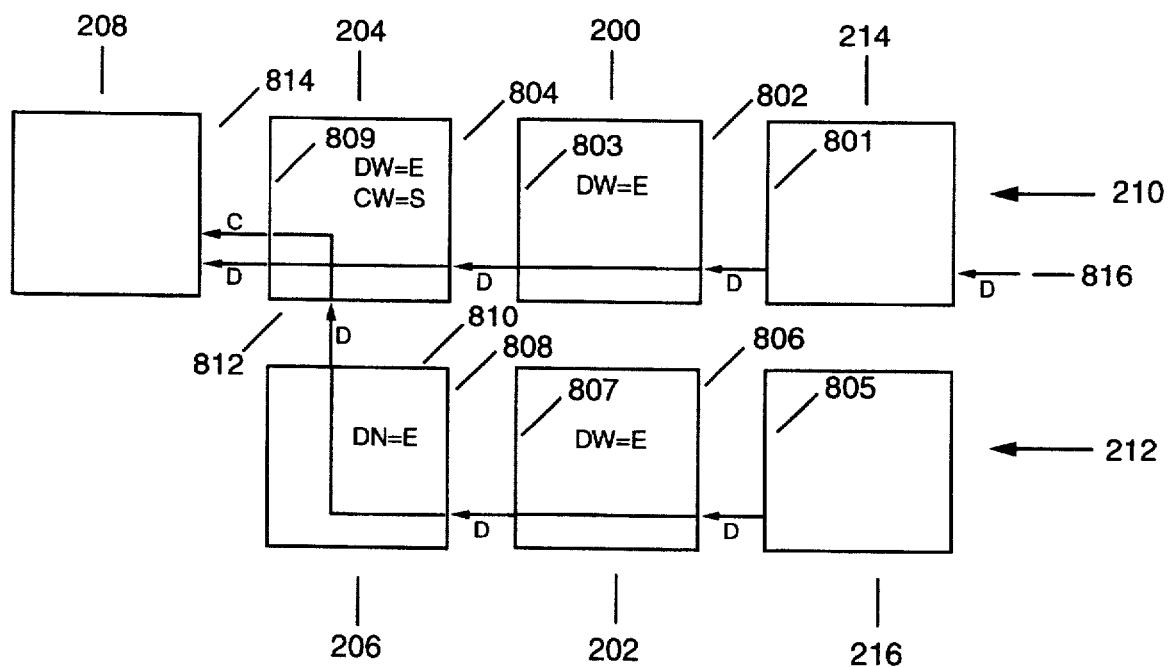
FIG. 3 illustrates two cells cooperatively configuring a non-adjacent target cell.

FIG. 3 shows a circuit called a two-channel wire. This circuit allows one region of a cell matrix to access to a non-adjacent cell's C and D input lines. The wire consists of two channels, called the Program Channel or PC, and the Control Channel or CC. The PC is made up of the cells 210, and is used to transport data (program information) to target cell 208's D input. The CC is made up of cells 212, and is used to transport control information to target cell 208's C input. The wire is designed so that initial PC cell 214 and initial CC cell 216 can cooperatively access the D and C lines of target cell 208.

In practice, initial PC cell 214 and initial CC cell 216 would themselves be receiving inputs from other circuitry, and passing those inputs along their respective channels. Therefore, their designation as "initial" cells should be taken within the current context rather than a more global one. For example, cell 214 might itself be passing D input 816 to its D output on side 801. Thus when we speak of controlling the D output of initial PC cell 214, this control might be achieved, for example, by modulation of D input 816, which itself might be controlled via an external system if it is a border cell, or via another cell's output if it is not a border cell. Similar comments apply to initial CC cells.

In FIG. 3, sides 801, 803 and 809 are all called connected output sides of their respective cells. Similarly, sides 805 and 807 are called connected output sides of their respective cells. Side 810 is also called a connected output side, but in more complicated contexts (to be described below), may instead be called a secondary connected output side. Sides 802, 804, 806 and 808 are similarly called connected input sides. Side 812, which belongs to a cell in the PC but receives data from a cell in the CC, will be called the secondary connected input side of cell 204. Side 814 of target cell 208 will be called its connected input side.

The operation of the wire is as follows. Cell 200 receives a data input on its DE input, which it routes to its DW output. This is connected to cell 204's DE input, and cell 204 routes it to its own DW output. This is connected to target cell 208's DE input. Therefore, any value presented to cell 200's DE input is transported to target cell 208's DE input. Thus initial PC cell 214 can access target cell 208's DE input via its own DW output.

Such an assembly of cells, where each passes its output to another's input, which subsequently passes it to its own output, then to an adjacent cell's input, and so on, is sometimes called a "bucket brigade" assembly.

We will speak of such an assembly as achieving an "information transfer" from one cell to another, or from one input to another. The simplest such information transfer is simply to copy a value from an input to an output. However, any information-preserving transformation may be performed during the transfer. For example, if the last cell of a bucket brigade assembly inverts the value being passed along the assembly, there is still an information transfer occurring, since the original value being transmitted can be recovered from knowledge of the final bit value.

Cell 202 receives a data input on its DE input, which it routes to its DW output. This is connected to cell 206's DE input. Cell 206 routes this input to its own DN output, which is connected to cell 204's DS input. Cell 204 additionally routes its DS input to its CW output. This is connected to target cell 208's CE input. Therefore, any value presented to cell 202's DE input is transported to target cell 208's CE input. Thus initial CC cell 216 can access target cell 208's CE input via its own DW output.

Having access to both the DE and CE inputs of target cell 208 is sufficient to allow modification of target cell 208's truth table memory, i.e., to change its programming and therefore its future behavior. Thus what can only be done directly by an adjacent cell can now be accomplished by the cooperative action of two non-adjacent cells.

We have used Boolean equations in FIG. 3 to indicate the programming of each cell. The notation is as follows:

{D or C}{N, S, W or E}={N, S, W or E}{operation{N, S, W or E {operation . . . }}}

The left hand side of each equation represents an output, and may be one of eight values: DN, DS, DW, DE, CN, CS, CW or CE. The right hand side represents a logical combination of D inputs. C inputs are not used by the lookup table, but rather determine the current mode of the cell (D-mode or C-mode). Therefore, an equation like CW=S in cell 204 means "The Control Output to the West equals the Data Input from the South." Unspecified outputs are understood to be fixed at 0. This representation of configuration information will be used in combination with schematic drawings in subsequent figures.

Figure 4:
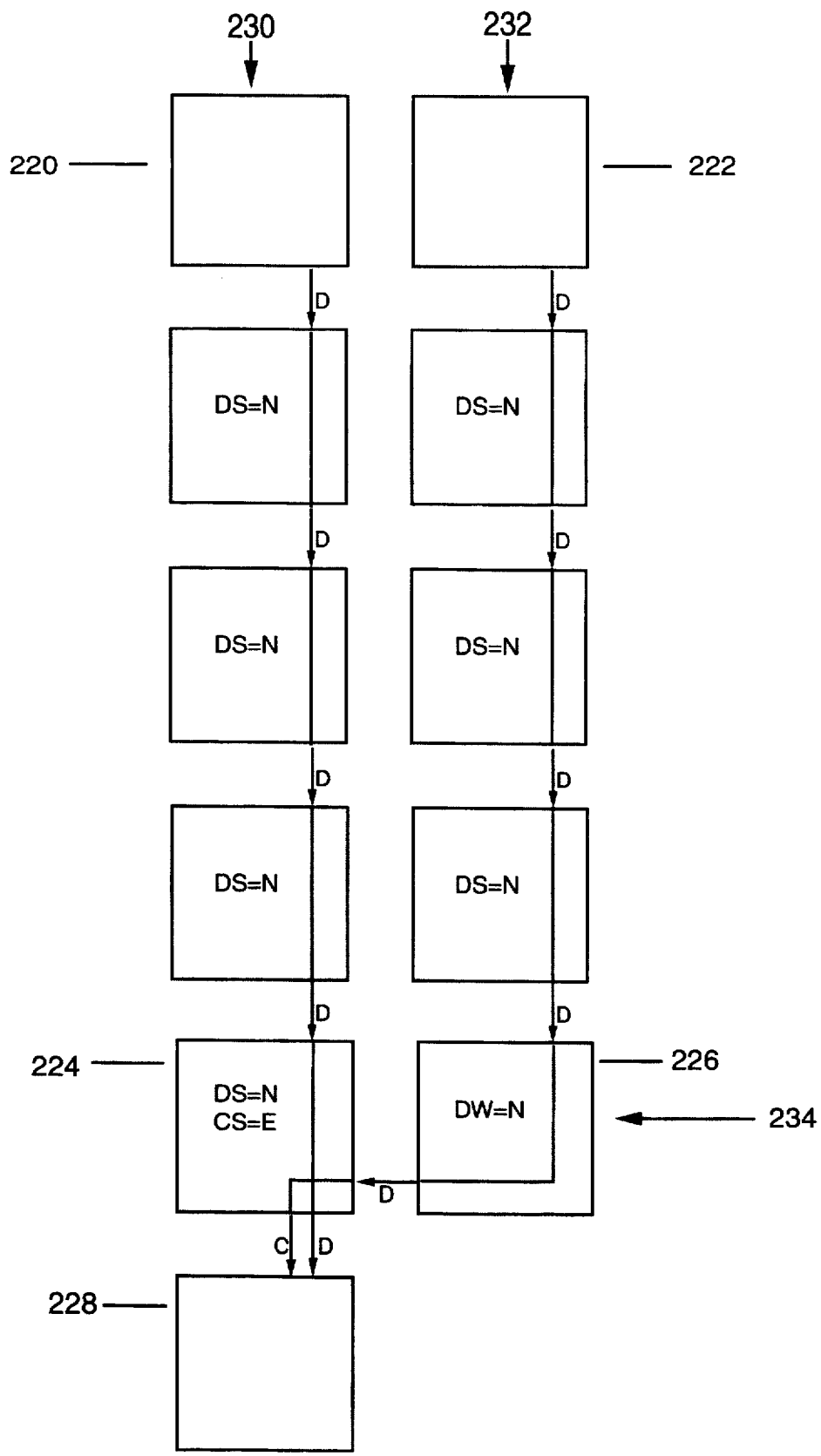
FIG. 4 illustrates a long two-channel wire for configuring a distant cell.

The wire shown in FIG. 3 is particularly short. FIG. 4 shows a longer wire. Here, initial PC cell 220 and initial CC cell 222 are controlling the D and C inputs respectively of target cell 228. Cells 230 make up the PC and cells 232 make up the CC as before. However, target cell 228 is now 5 cells away from the controlling cells 230 and 232. In general, a two-channel wire can be used to access cells which are arbitrarily far away.

Most of the cells in FIG. 4 are configured with the simple equation DS=N. There are however two cells which are configured differently. Cell 226 feeds the CC data from the North to its Western neighbor, cell 224. Cell 224 not only passes its DN input to its DS output, but also passes its DE input (from the CC) to its CS output. Cells 226 and 224 are collectively called the head cells of the wire. Their location 234 in the wire is called the head of the wire. The target cell is thus adjacent to the head of the wire.

FIG. 4 also shows that there is nothing special about the orientation of the channels in a two-channel wire, nor about the specific configuration of each channel. All that is required is that each channel pass data from one end to the other, that the head cells be adjacent to each other, and that the head cells route the PC and CC to the D and C inputs of the target cell.

Figure 5:
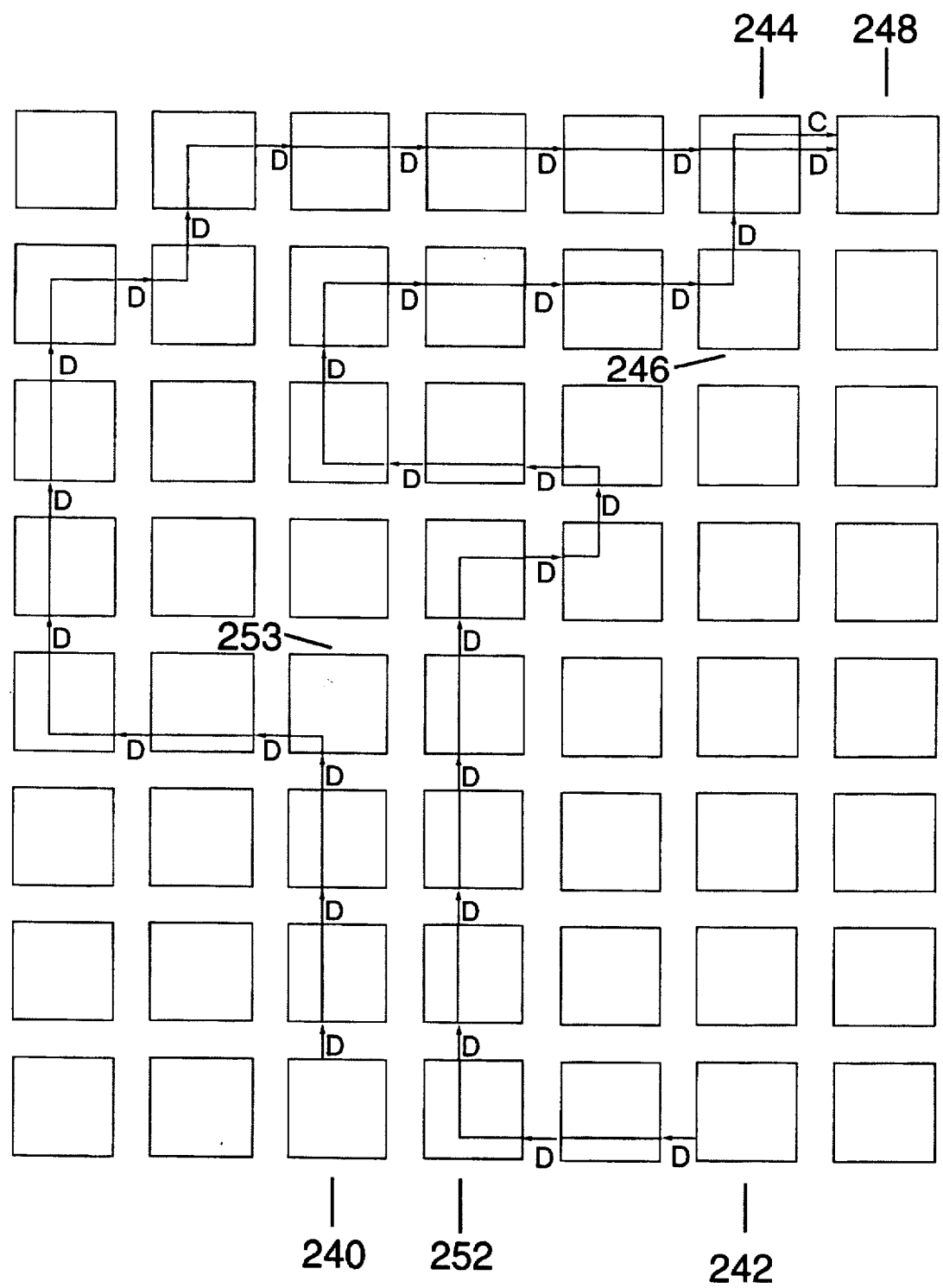
FIG. 5 illustrates a non-linear wire with two non-parallel channels.

FIG. 5 shows another example of a two-channel wire, which further illustrates some of the variability which is possible. Initial PC cell 240 is the beginning of the PC, and its DN output is delivered to head cell 244. Initial CC cell 242 is the beginning of the CC, and its DW output is delivered to head cell 246. The PC and CC are no longer composed of linearly-arranged cells. For example, initial PC cell 240's DN output is delivered through two cells until it reaches cell 253's DS input, but cell 253 sends its DS input to its own DW output. Likewise, initial CC cell 242's DW output is delivered through one cell to cell 252's DE input, but cell 252 sends its DE input to its own DN output, and so on. Both the PC and CC take a number of turns, and in general are not even adjacent to each other. However, head cells 244 and 246 are adjacent to each other, and collectively deliver the PC and CC inputs to target cell 248's DW and CW inputs, respectively. Thus initial PC cell 240 and initial CC cell 242 can, collectively, configure the truth table memory in target cell 248.

Figure 6:
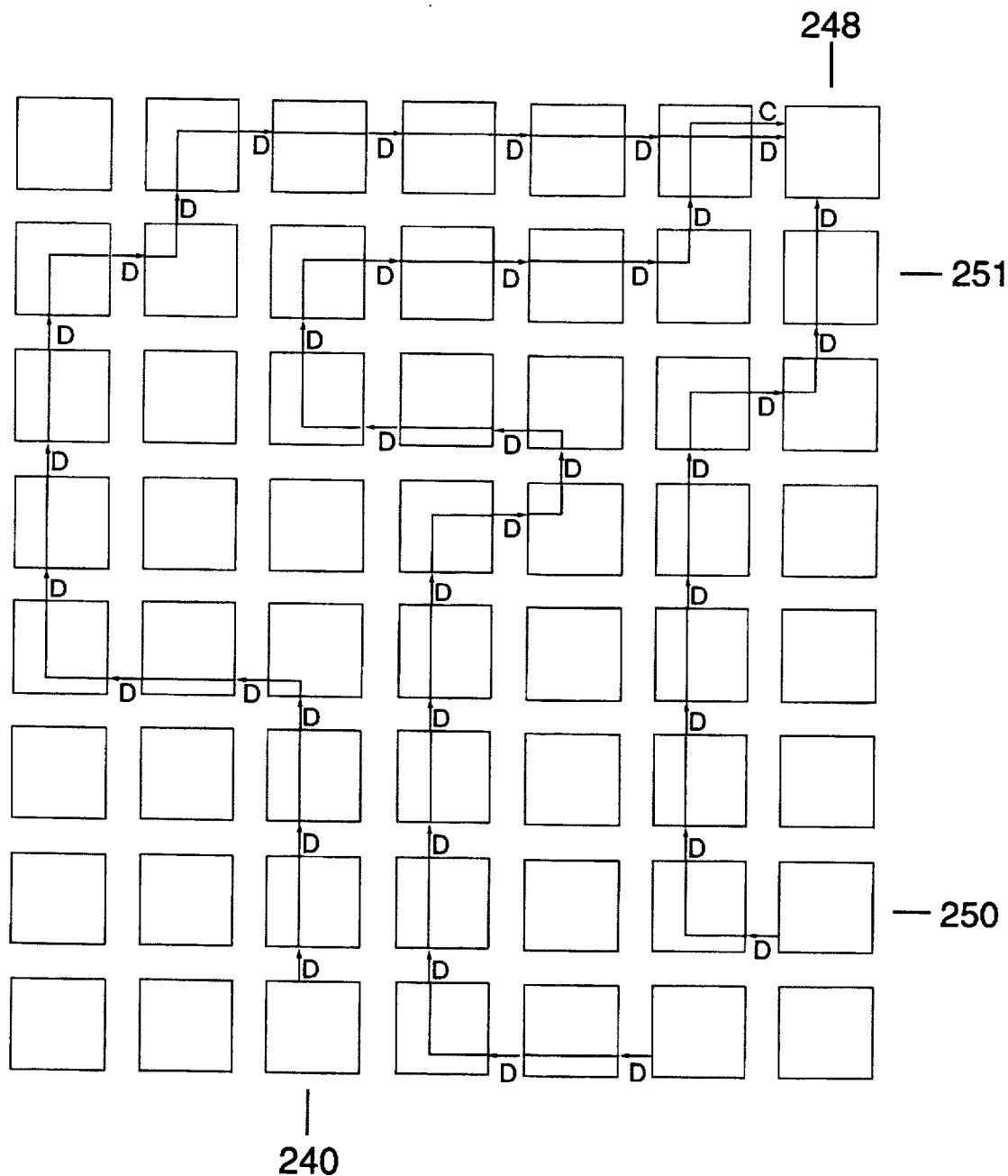
FIG. 6 illustrates a non-linear wire with three non-parallel channels.

The notion of a two-channel wire can be extended in general to a multi-channel wire. FIG. 6 shows a three-channel wire. Here, initial cell 250 is outputting data to its DW output, which is being passed along by a series of cells, until it arrives at the DN output of cell 251, which is connected to the DS input of target cell 248. This three-channel wire is useful because not only can target cell 248 be configured, but now two of its D inputs are accessible. For example, target cell 248 could be configured as a two-input AND gate with equation DN=W .AND. S. Since initial PC cell 240 and initial cell 250 supply D inputs to the West and South, respectively, of target cell 248, they could be used as inputs to this remote AND gate. Thus multi-channel wires can be used not only to configure remote cells, but to interact with them.

In a similar way, multi-channel wires may contain many such auxiliary channels.

Figure 7:
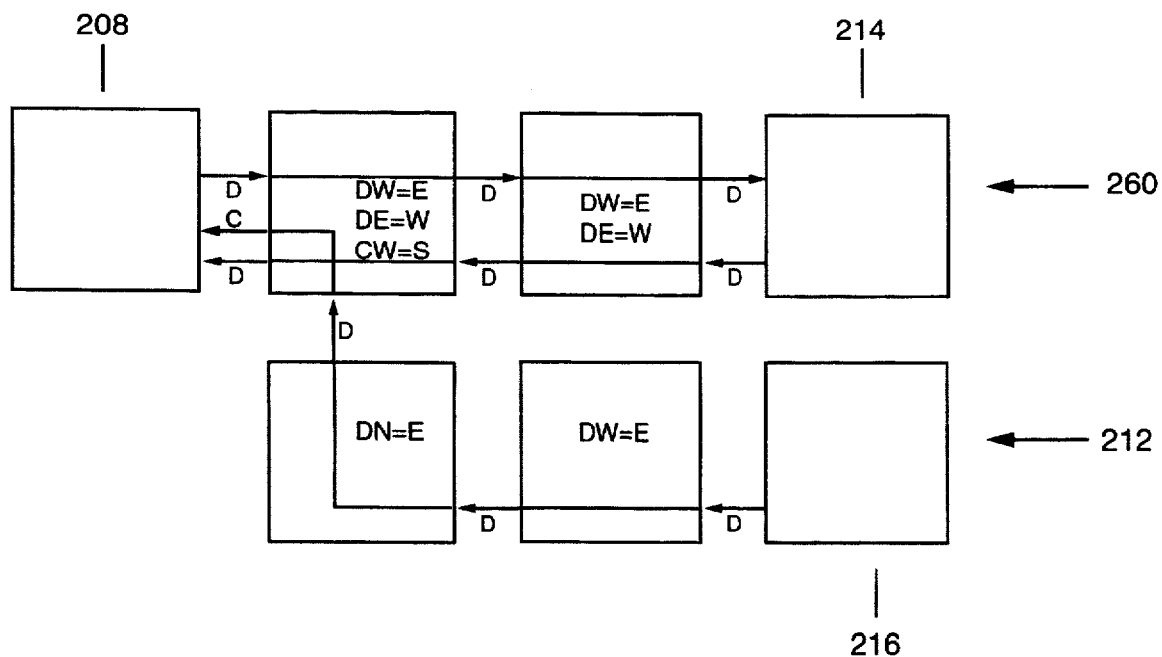
FIG. 7 illustrates a bi-directional wire.

FIG. 7 shows a variation on the basic two-channel wire of FIG. 3. Again, initial PC cell 214 and initial CC cell 216 control the D and C input respectively of target cell 208, and control channel 212 is the same as in FIG. 3. However, the cells composing program channel 260 have been modified slightly; besides executing the logical function DW=E they also execute DE=W, i.e., they each pass data from their DW input to their DE output. In this way, initial PC cell 214 can now read the DE output from target cell 208. This configuration is called a bi-directional wire. It has the advantage that the controlling cells can cooperatively read a non-adjacent target cell's truth table, by asserting one of the target cell's C inputs and reading the corresponding D output.

Figure 8:
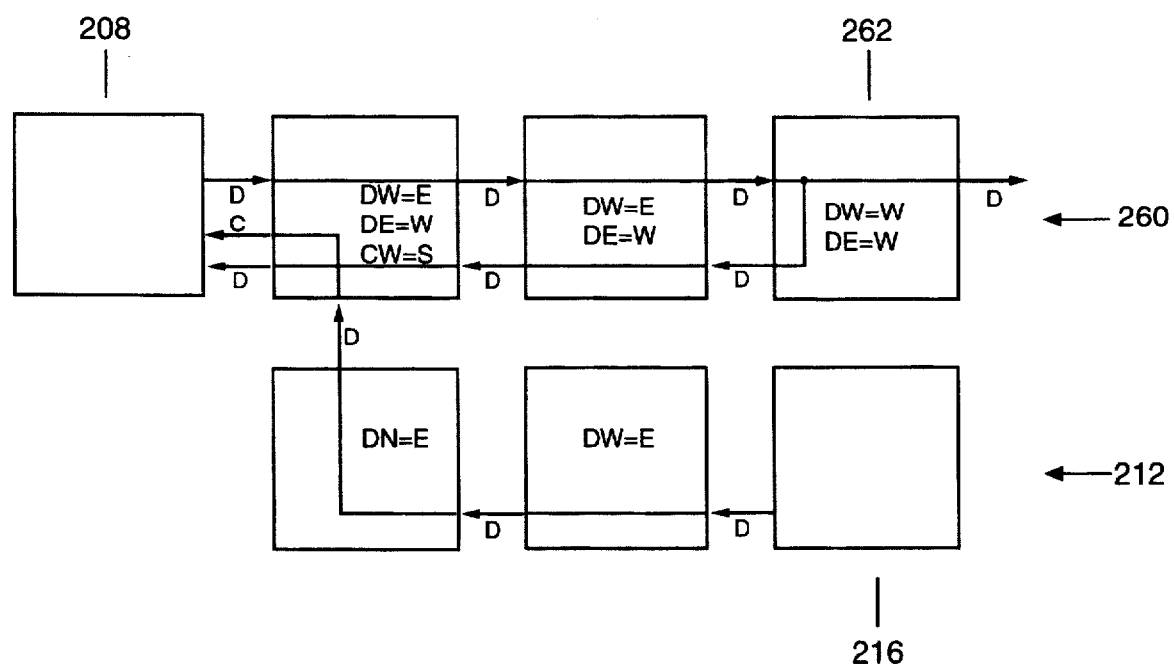
FIG. 8 illustrates a bi-directional wire used to non-destructively read a remote target cell.

FIG. 8 shows one use of a bi-directional wire, to perform a non-destructive read on a non-adjacent cell. The configuration works exactly as in FIG. 7, except that initial PC cell 262 is configured to perform the functions DW=W and DE=W. If initial CC cell 216 outputs a one to its DW output, then target cell 208 will be placed in C-mode. Its current truth table will be delivered along program channel 260, where initial PC cell 262 will re-transmit it back to target cell 208, while also copying that truth table to its DE output. Target cell 208's truth table is thus read non-destructively, while being transmitted to initial PC cell 262's DE output. Thus, by using a bi-directional wire, initial PC cell 262 can perform a non-destructive read on non-adjacent target cell 208.

FIG. 8 illustrates a general modification which can be made to the cells of a two- or multi-channel wire. Whenever a cell is transferring information from a D input to a D output, that information may also be transferred to one or more additional D or C outputs of the cell.

A two-channel wire not only allows access to a remote target cell at the head of the wire, but also allows indirect control over cells near the target cell. FIGS. 9A–9D illustrate a configuration sequence for programming a secondary target cell. First, in FIG. 9A target cell 280 is configured with the equations "CS=1 DS=E." This is done by setting control channel 212 to 1 (thereby asserting target cell 280's CE input), and sending the truth table for the above Boolean equations into program channel 210, as indicated by the equations inside initial PC cell 214. Following one complete programming cycle, the cells are configured as in FIG. 9B. If control channel 212 is now set to 0, any data sent through program channel 210 will be routed by target cell 280 into secondary target cell 282's DN input. Additionally, secondary target cell 282's CN input is 1, as asserted by target cell 280's CS output. Therefore, the truth table sent through program channel 210 will be loaded into secondary target cell 282's truth table memory, thereby programming this secondary target cell. For illustration, we will simply call this truth table X, rather than listing explicit Boolean equations. X may be any desired truth table (provided its CN output is not asserted). Again the notation "{X}" inside initial PC cell 214 is used to indicate that it is outputting a truth table corresponding to equation(s) "X."

Figure 9A:
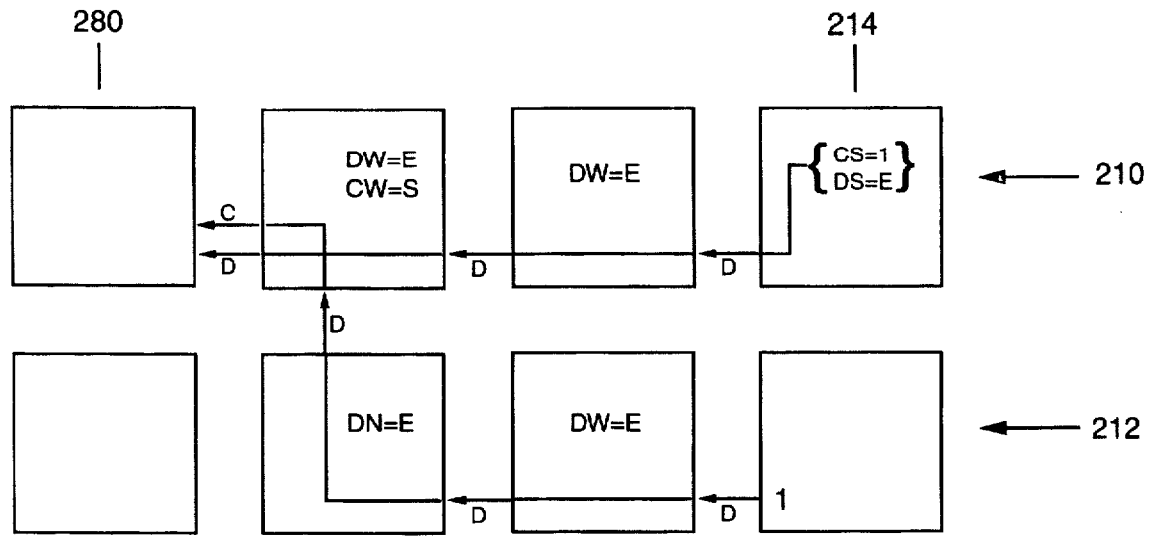
FIGS. 9A–9D illustrate two cells being configured near the head of a two-channel wire.
Figure 9B:
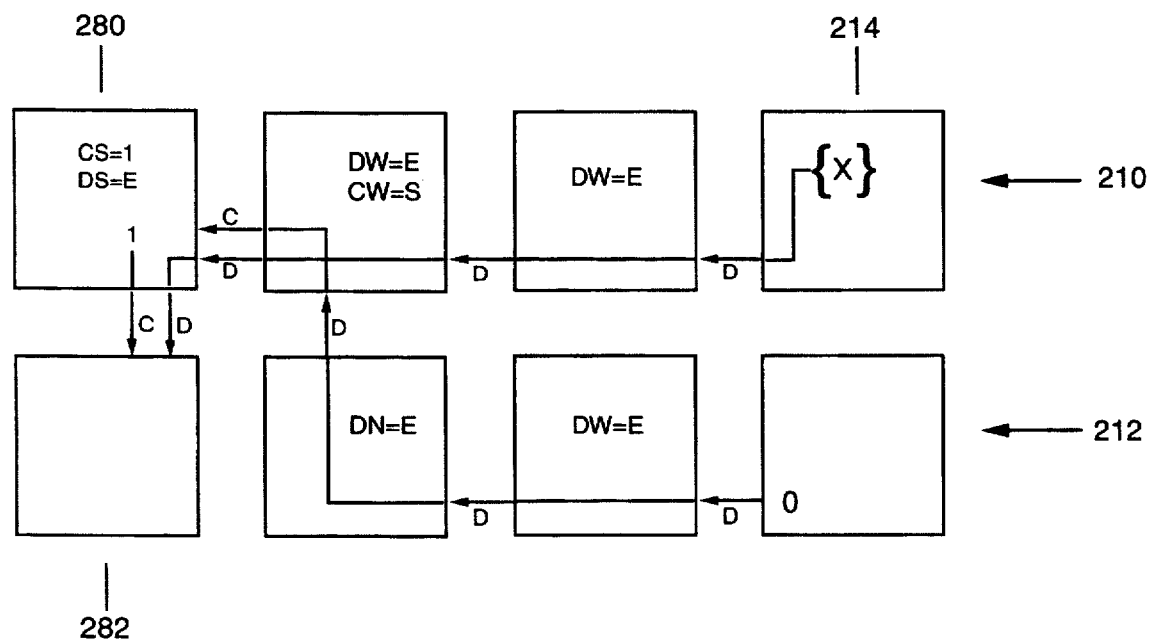
Figure 9C:
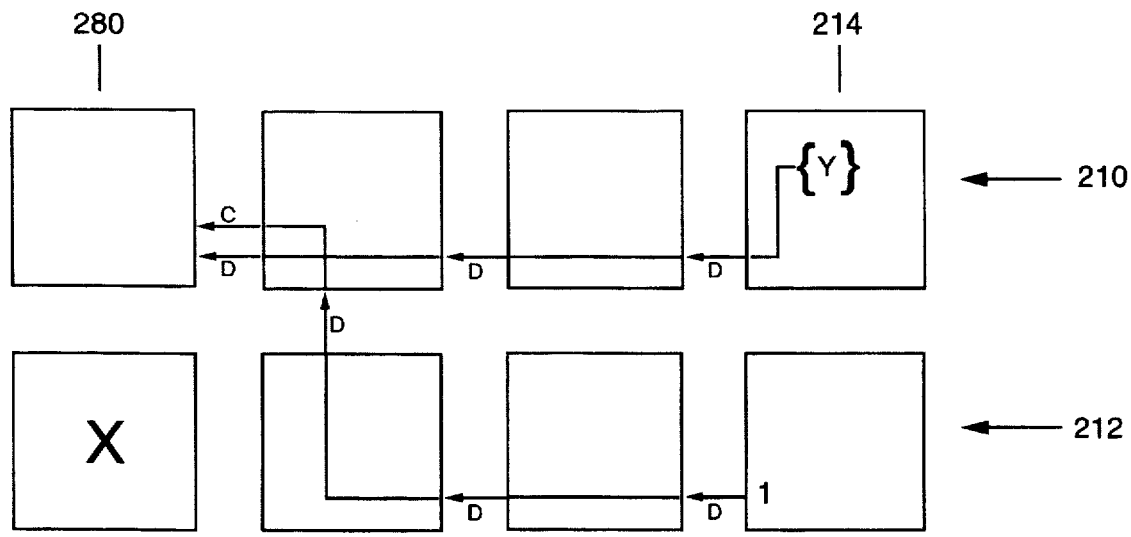
Figure 9D:
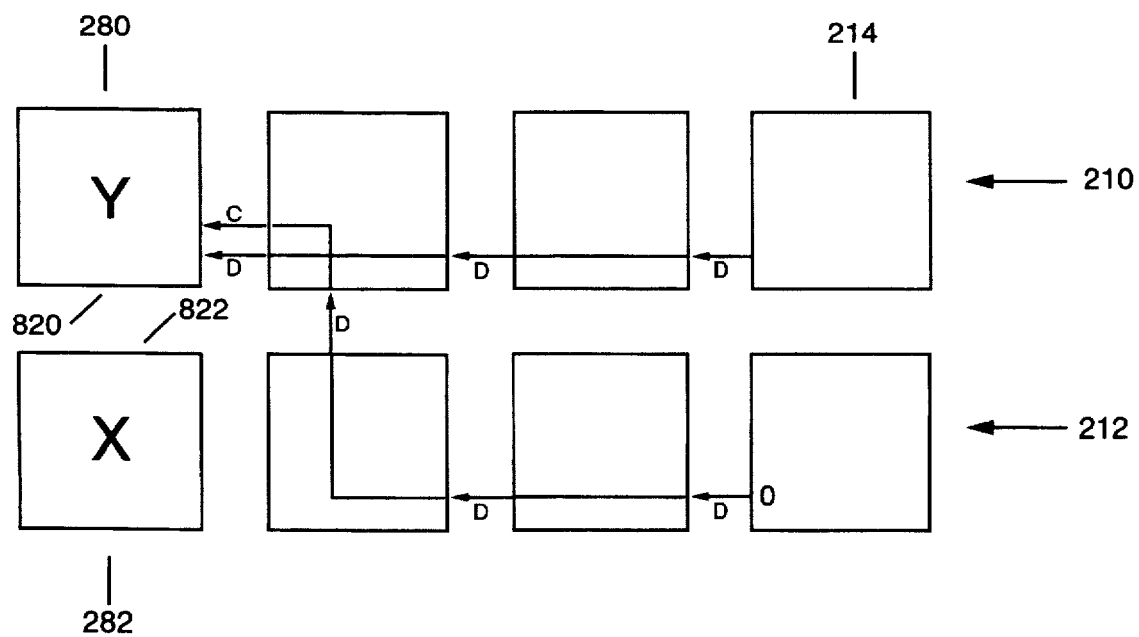

In FIG. 9C (where secondary target cell 282 has now been configured with equations X), control channel 212 is set to 1, and truth table Y is sent through program channel 210 by initial PC cell 214, thereby configuring target cell 280 with truth table Y. FIG. 9D shows the final configuration, and illustrates that two target cells 282 and 280 have now been configured remotely with desired truth tables X and Y respectively. Therefore a two-channel wire can be used to configure small regions of cells around the head of the wire. With control channel 212 now set to 0, initial PC cell 214 can send data to target cell 280 and interact with this newly-configured circuit.

In a situation such as FIG. 9D, side 820 of cell 280 will be called the secondary connected input side, and side 822 of cell 282 will be called its secondary connected output side. The reason for this terminology is apparent in the case where cell 282 has been configured to act as a new CC head cell and cell 280 has been configured to act as a new PC head cell.

While the configuration sequence illustrated in FIGS. 9A–9D allows cells near the target cell to be configured, it is not a practical way to configure a large remote region. The sequence of cooperating steps required to access a cell N locations away from the target grows exponentially ($2^N$). With this growth rate, configuring a single cell 64 locations away from the end of a wire would require on the order of $2^{64}$ steps, or approximately 18 million trillion steps. Clearly this is not an acceptable programming methodology.

Figure 10A:
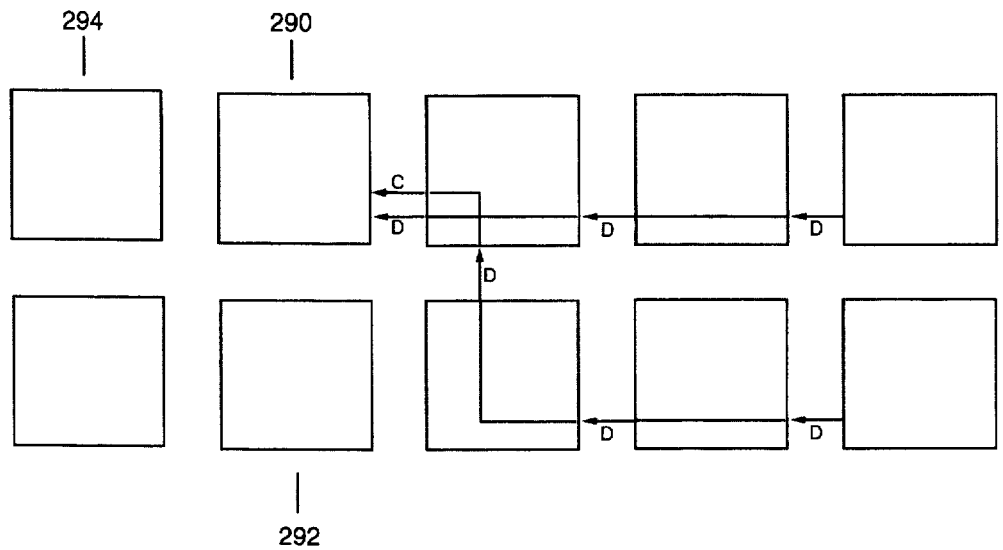
FIGS. 10A–10C illustrate a difficulty in trying to extend a simple two-channel wire.

Instead, what is needed is a way to extend a wire, to change the location of the wire's head. FIG. 10A shows the usual two-channel wire. Cell 290 is the current target cell of the wire, and the goal is to extend the wire to make cell 294 the new target cell. Using the techniques illustrated in FIGS. 9A–9D, target cells 290 and 292 can be configured to look like new head cells for the wire, resulting in the configuration shown in FIG. 10B, where target cells 290 and 292 have been configured with the same truth tables as head cells 204 and 206. However, even though we have replicated the head cells, we have not actually extended the wire. If control channel 212 is set to 1, it is still target cell 290 which will be configured. We have extended the structure of the wire, but we have not moved the location of the head.

Figure 10B:
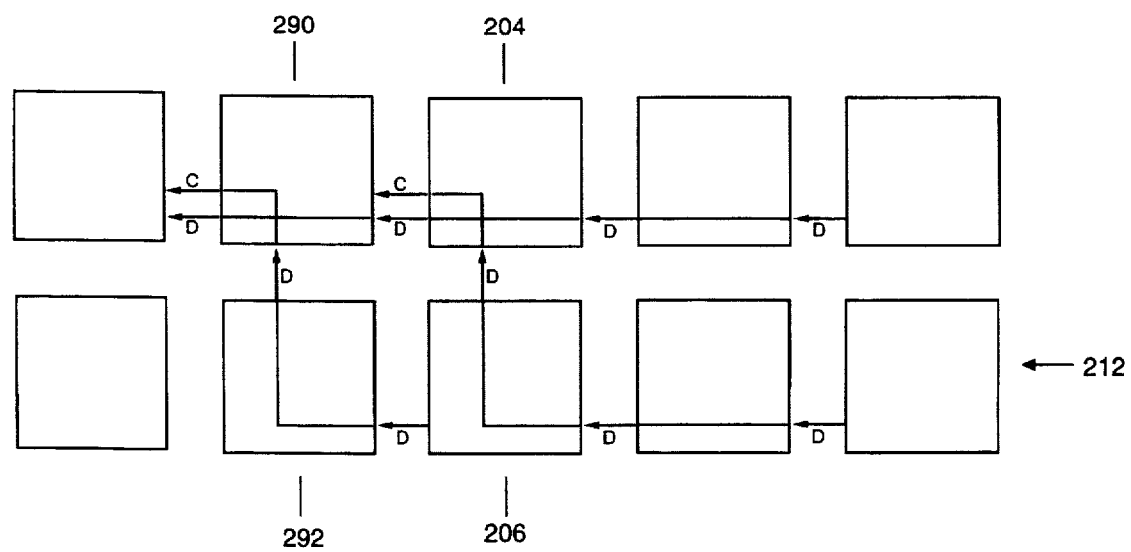
Figure 10C:
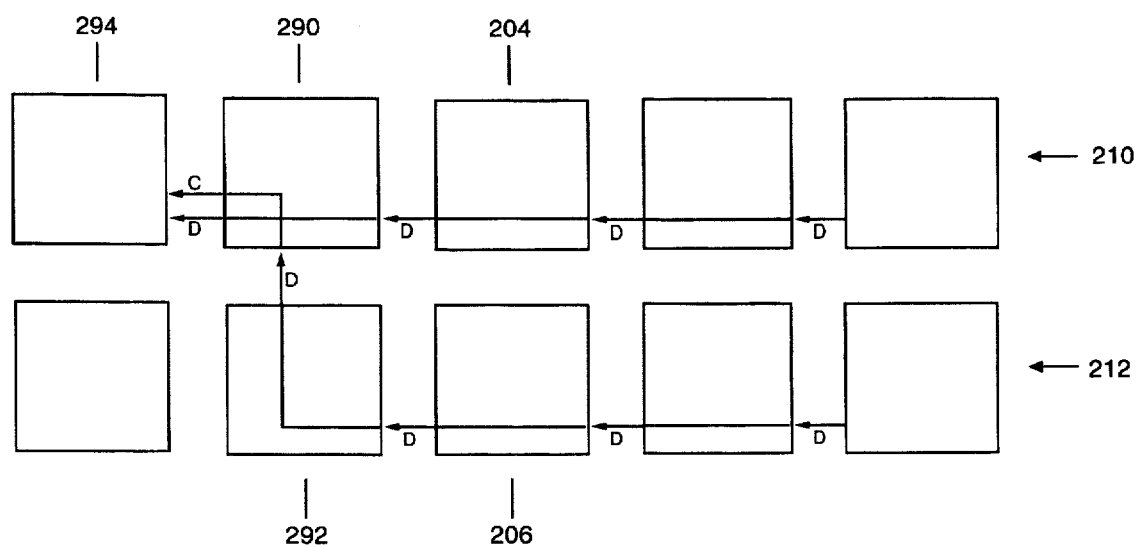

FIG. 10B shows that we have created what looks like new head cells 290 and 292, but what is missing is the decommissioning of current head cells 204 and 206. FIG. 10C shows the desired final configuration, where head cells 204 and 206 have now been reprogrammed to look like the other cells along program channel 210 and control channel 212, respectively. This allows target cell 294 to be remotely accessed. However, there is no easy way to reprogram the original head cells 204 and 206, for at least three reasons:

1. A two channel wire asserts control over the cells beyond the head cells, i.e., cells 290 and 292, not head cells 204 and 206.
2. Since head cells 204 and 206 are critically involved in programming operations using the wire, trying to reprogram these cells can disrupt the operation of the wire.
3. If you do successfully decommission head cells 204 and 206 (i.e., turn them into regular program channel and control channel cells such as 200 and 202), you need to have the new head cells 290 and 292 already constructed, since you can no longer program the original target cell 290 once head cells 204 and 206 are decommissioned.

Therefore, it is not practical to extend the two-channel wire via reprogramming of the cells already composing the wire. Instead, the wire can be extended by using a back-propagated signal fed from the new head cells to the former head cells, and configuring the head cells to be decommissioned when they receive this signal. Such a configuration is called an extendible wire.

Figure 11:
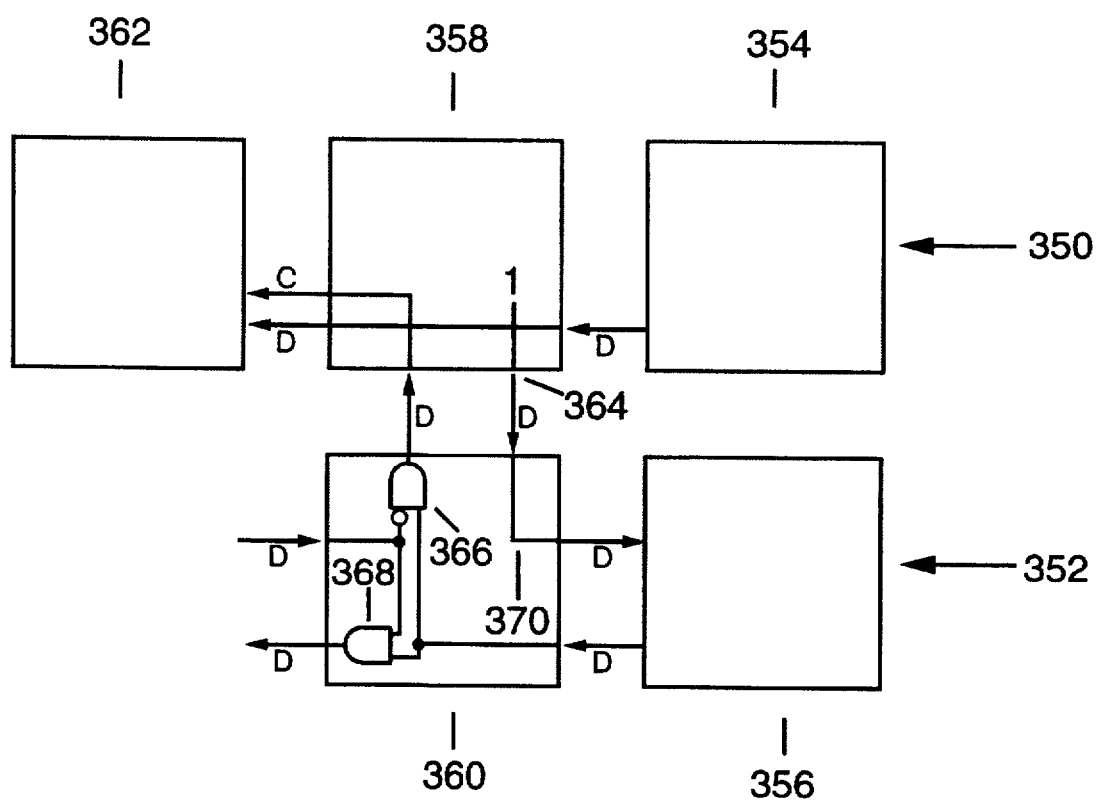
FIG. 11 illustrates a two-channel wire which can be extended.

FIG. 11 illustrates a two-channel extendible wire. Cells 350 form the program channel for accessing the DE input of target cell 362. Cells 352 form the control channel for accessing the CE input of target cell 362. If initial PC cell 354 outputs a 1 to its DW output, then target cell 362's DE input will be asserted. Similarly, if initial CC cell 356 outputs a 1 to its DW output, then target cell 362's CE input will be asserted. Thus initial PC cell 354 and initial CC cell 356 can collectively program target cell 362.

The behavior of this wire is thus similar to the wire in FIG. 3, but the way the cells cooperate to achieve this behavior is quite different. Head cell 358 transfers its DE input to its DW output, and also transfers its DS input to its CW output, similar to head cell 204 in FIG. 3. Head cell 360 is, however, quite different from head cell 206 in FIG. 3. Head cell 360 uses AND gates 366 and 368 to conditionally pass its DE input to either its DN output or its DW output. The exact routing is based on the value of its DW input:

| DW input Value | DN Output Value | DW Output Value |
|---|---|---|
| 0 | DE | 0 |
| 1 | 0 | DE |

Thus head cell 360's DE input is either presented to its DN output (where it subsequently reaches target cell 362's CE input), or to its DW output, where is has no direct affect on target cell 362. Note that if the cell to the West of head cell 360 is blank (meaning its truth table contains all zeros), then head cell 360's DW input will be 0. Note also that head cell 358 is asserting 1 to its DS output 364, and head cell 360 routes its DN input to its DE output via configured routing 370. Thus head cell 360 is outputting a 1 on its DE output on account of the presence of head cell 358 to its North. This is the key to extending the wire.

FIG 11 illustrates another generalization which can be made to an information transfer circuit, where the value passed from an input to an output may be conditionally modified by the value of another input.

Figure 12:
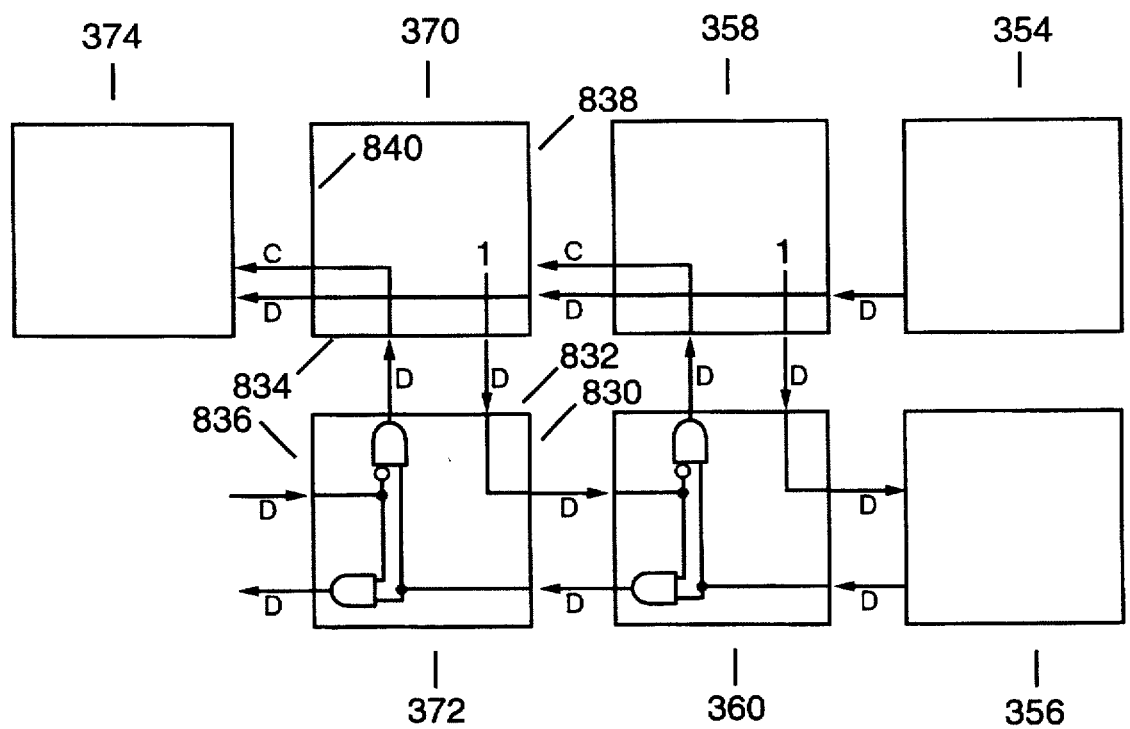
FIG. 12 illustrates an extension of the two channel wire in FIG. 11.

FIG. 12 shows what happens if another copy of head cells 358 and 360 are added to the head of the wire. Again, initial PC cell 354 and initial CC cell 356 are using their DW outputs to control the program channel and control channel of the wire. In this configuration though, cell 370 is asserting 1 to its DS output, and cell 372 is passing that 1 to its DE output, so former head cell 360 receives a 1 on its DW input. This means that former head cell 360 will transmit its DE input to its DW output, and will present 0 to its DN output. Thus former head cell 358 will never assert its CW output. On the other hand, cell 372 is receiving a 0 on its DW input (assuming the cell to its West is blank), and therefore passes its DE input to its DN output, which cell 370 passes to its CW output. Cells 370 and 372 are thus the new head cells of the wire, and collectively allow initial PC cell 354 and initial CC cell 356 to manipulate target cell 374's DE and CE inputs.

The key to this wire is that head cell 370's configuration is identical to former head cell 358's configuration, and head cell 372's configuration is identical to former head cell 360's configuration. The simple act of configuring head cells 372 and 370 will extend the wire. Moreover, until head cell 370 is configured, the head of the wire remains at cells 358 and 360. Thus direct control over former target cell 370 is maintained until the final configuration of target cell 370 as a head cell is achieved, and at that point, the head of the wire moves. The wire shown in FIG. 12 can be continually extended in this manner, thereby changing the location of the head cells and thus the location of the target cell. This allows efficient access to and control over remote, non-adjacent cells within the cell matrix.

At this point it is useful to introduce some further terminology. In FIG. 12, each PC cell receives a D input on one side, called its connected input side. For cell 370 this side is 838 Each PC cell passes that D input to a D output on a side called its connected output side, which is side 840 for cell 370. Additionally, each PC cell outputs a 1 to a side called its signal output side, which is side 834 for cell 370. Finally, each PC cell receives an input from the CC through a D input on a side called its secondary connected input side (which is different from the naming of a non-extendible wire). In FIG. 12, the secondary connected input side is the same as the signal output side, but in general this need not be the case.

Similarly, each CC cell receives a D input on its connected input side (side 830 for cell 372), and conditionally transmits it to the PC via the D output of its secondary connected output side (832 for cell 372). Each CC may also conditionally transfer this D input to an adjacent CC cell via its connected output side (side 836 for cell 372). These conditional transfers generally depend on the value of an incoming D input on a side called the feedback input side (side 836 for cell 372). In general, a cell's feedback input side and connected output side need not be the same.

Additionally, each CC cell receives a signaling input from a PC cell through its signal input side, which in FIG. 12 is the same as cell 372's secondary connected output side, but in general need not be the same side. Finally, each CC cell transfers this signaling input to a side called its feedback output side, which in FIG. 12 is the same as its connected input side.

Figure 13:
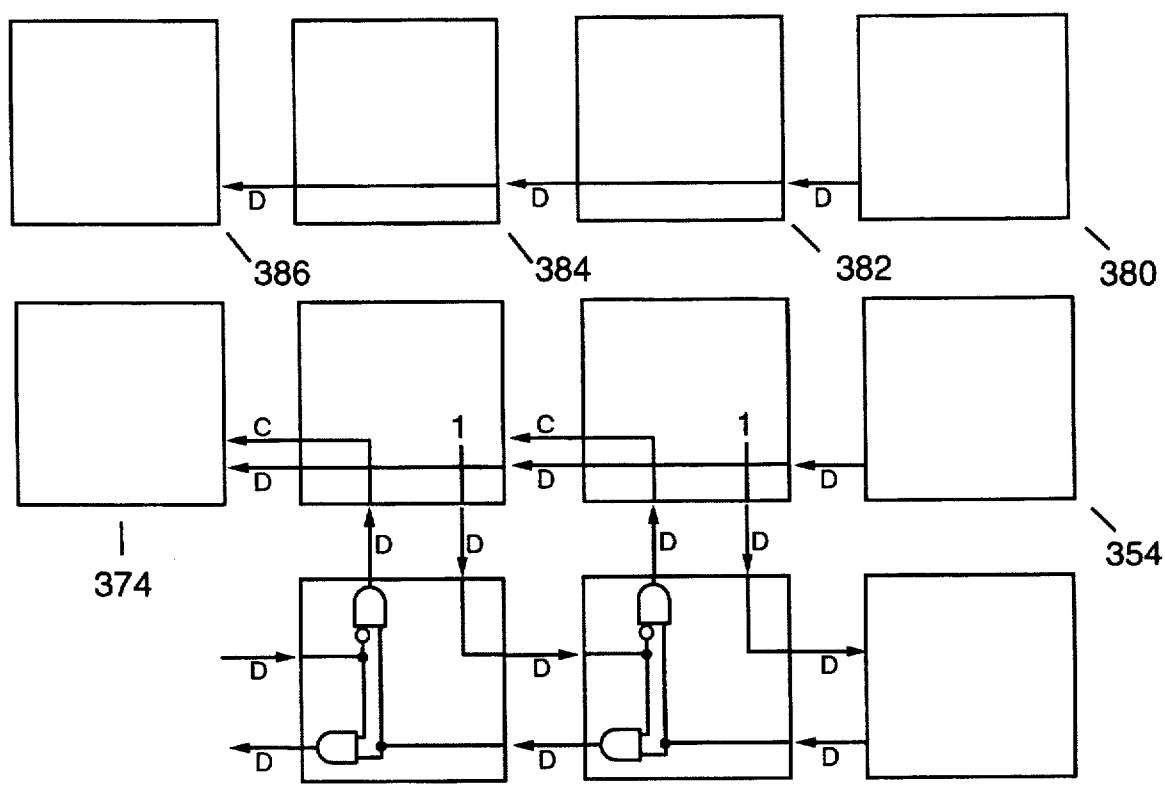
FIG. 13 illustrates a three-channel extendible wire.

FIG. 13 shows the same extendible wire, but with an added line controlled by initial cell 380. Initial cell 380's DW output is connected to cell 382's DE input, transferred to its DW output, where it is connected to cell 384's DE input. Cell 384 transmits this input to its DW output, which is connected to target cell 386's DE input. This collective three-channel wire thus allows initial cells 354 and 380 to send two independent signals to the remote region containing target cells 374 and 386, respectively. Note that cells 382, 384 and 386 are not part of the extendible two-channel wire, but rather are built alongside the two-channel wire. Additional lines can be built alongside a basic two-channel wire, on either side, in any desired configuration. Such a configuration is more generally called a multi-channel wire. Lines can be uni- or bi-directional, and need not be parallel to the two-channel wire.

Figure 14:
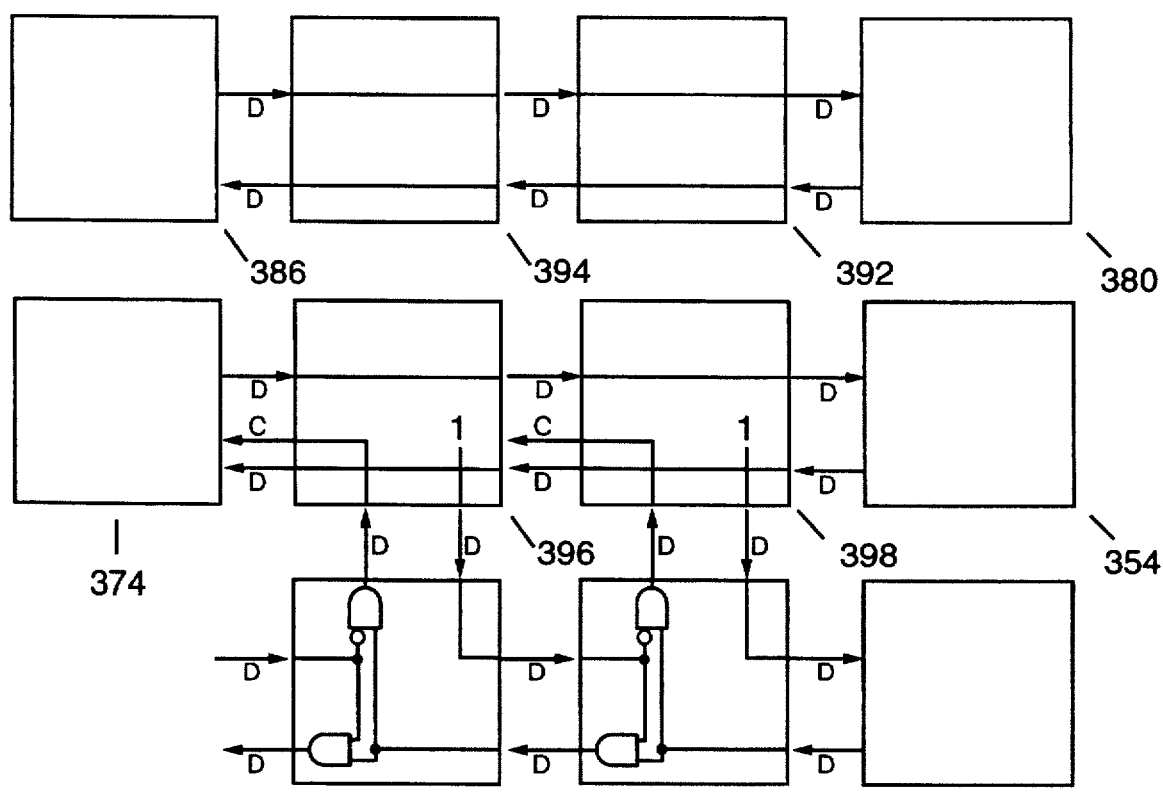
FIG. 14 illustrates a three-channel extendible bi-directional wire.

FIG. 14 shows a three-channel wire which contains bi-directional lines. Cells 398 and 396 transmit D information between target cell 374 and initial PC cell 354, while cells 392 and 394 transmit D information between target cell 386 and initial cell 380. Thus a remote circuit containing target cells 374 and 386 can exchange two bits of data with a circuit containing initial cells 354 and 380.

Figure 15A:
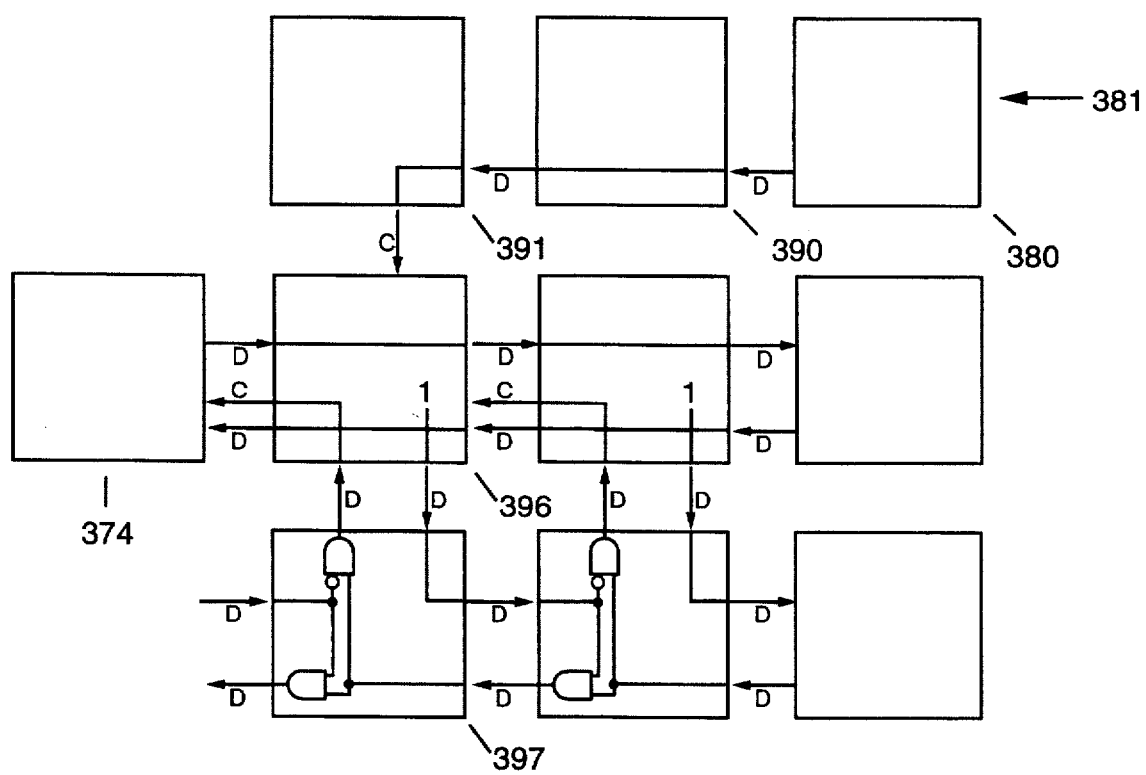
FIGS. 15A–15B illustrate the configuration and use of a break line.

A multi-channel wire need not only be used to transmit D information from one source cell to a cell near the head of the wire. FIG. 15A shows a particular type of three-channel wire, where the third line is configured to act as a break line. This is a useful circuit for returning the head of a wire to a previous location. In this configuration, initial break cell 380 controls break line 381. Initial break cell 380's DW output is connected to cell 390's DE input. Cell 390 transmits its DE input to its DW output, which is connected to cell 391's DE input. Cell 391, however, transmits its DE input to its CS output. This CS output is connected to cell 396's CN input. Therefore, initial break cell 380 has access to cell 396's CN input. This means that by asserting its DW output, initial break cell 380 can place cell 396 into C-mode.

Figure 15B:
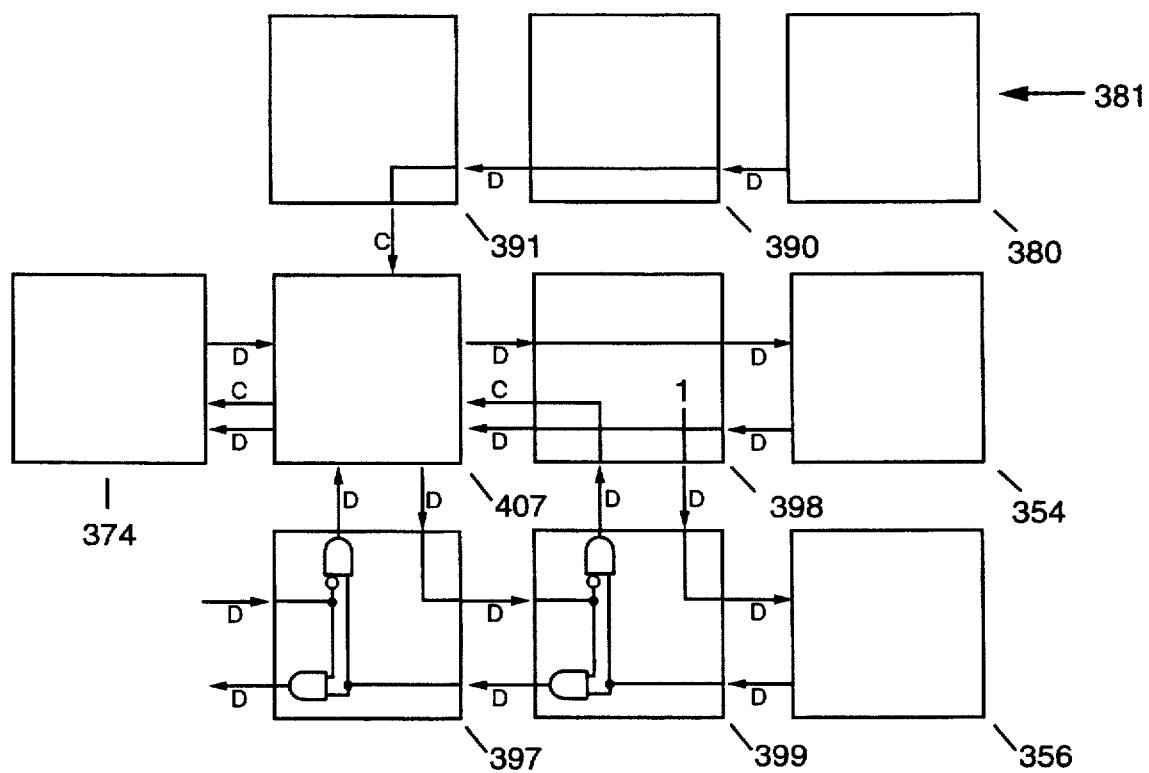

In the configuration as shown in FIG. 15A, cell 374 is the current target cell, and cells 396 and 397 are the head cells of the wire. If initial break cell 380 now asserts its DW output, cell 396 will be placed in C-mode, and will begin loading its DN input into its own truth table. Since cell 391's DS output is 0, cell 396 loads 0 into its truth table. After 128 clock cycles (assuming a 128-bit truth table memory), cell 396's truth table has been completely cleared. FIG. 15B shows the resulting configuration. Here, since cell 407's truth table contains all 0s, cell 407 will output 0 to its DS output, which cell 397 will pass to cell 399's DW input. Therefore, cell 356's DW output will be transmitted to the CE input of cell 407, while cell 354's DW output is transmitted to cell 407's DE input. Cells 398 and 399 are the new head cells of the wire, and cell 407 is the new target cell. The wire has been "broken," and the target cell moved back from cell 374 to cell 407.

Using this scheme, a wire can be extended, but a break cell 391 can be deposited to allow the target cell to return to a previous location under the control of initial break cell 380. This is useful, for example, for snaking a wire throughout different regions of the matrix.

Multiple break lines can also be established. For example, in FIG. 16, initial secondary break cell 401 is controlling a second break line, consisting of a single cell 403. As in FIG. 15A, initial break cell 380 controls break cell 391, and can be used to move the head of the wire to cell 396. However, initial secondary break cell 401's DW output is connected to break cell 403's DE input, which is transmitted to its DS output, which cell 405 now transmits to its CS output. Thus, if initial secondary break cell 401 asserts its DW output for 128 clock cycles, cell 398 will be cleared, and cell 398 will become the new target cell.

Figure 16:
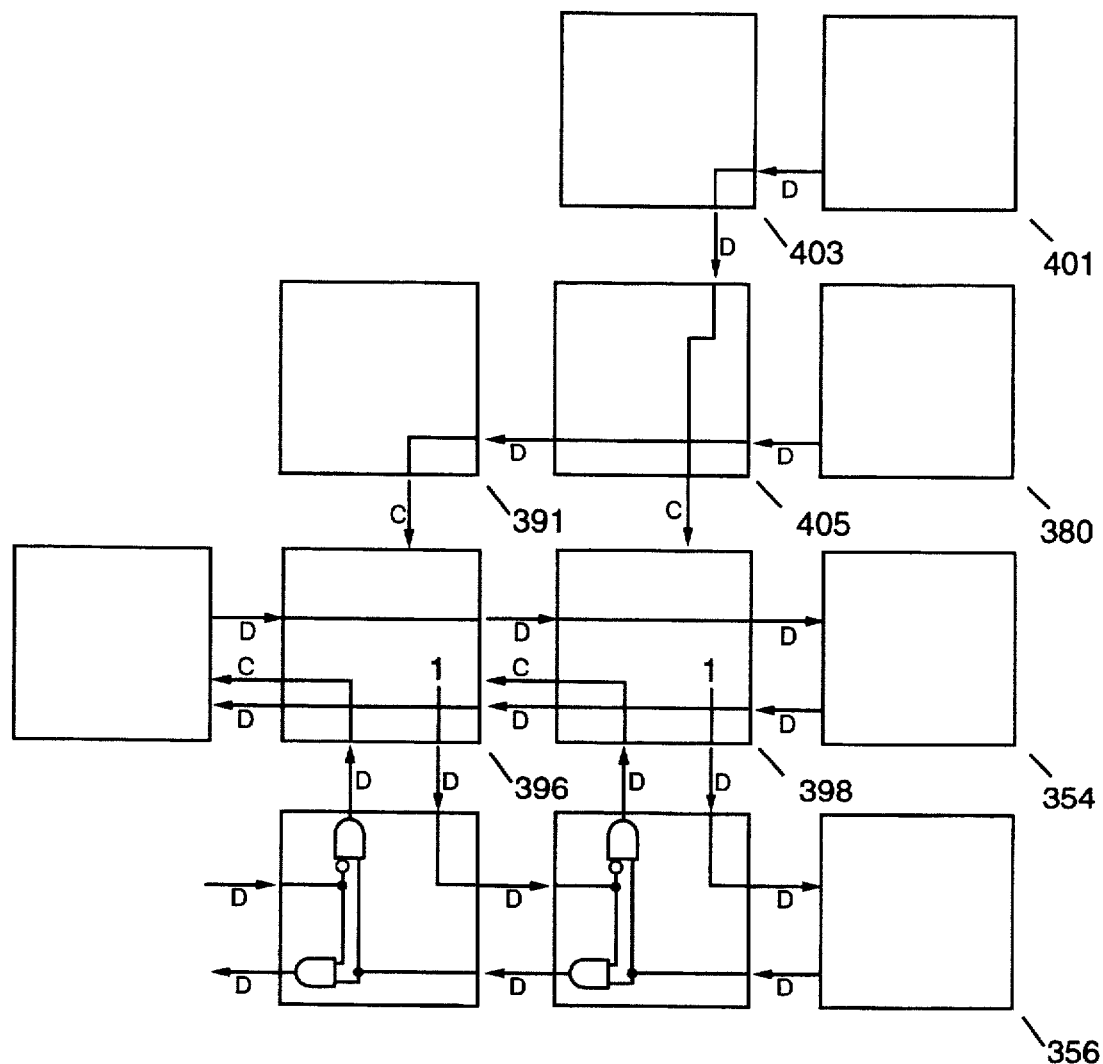
FIG. 16 illustrates a wire with two break lines.

Note that in FIG. 16, the two break likes intersect at and share a common cell, cell 405.

Of course, in this example, there is little difference between moving the target cell to cell 398 vs. cell 396, since they are adjacent to each other. However, break cells 403 and 391 could be very far from each other, in which case initial secondary break cell 401 and initial break cell 380 would accomplish quite different objectives.

Figure 17:
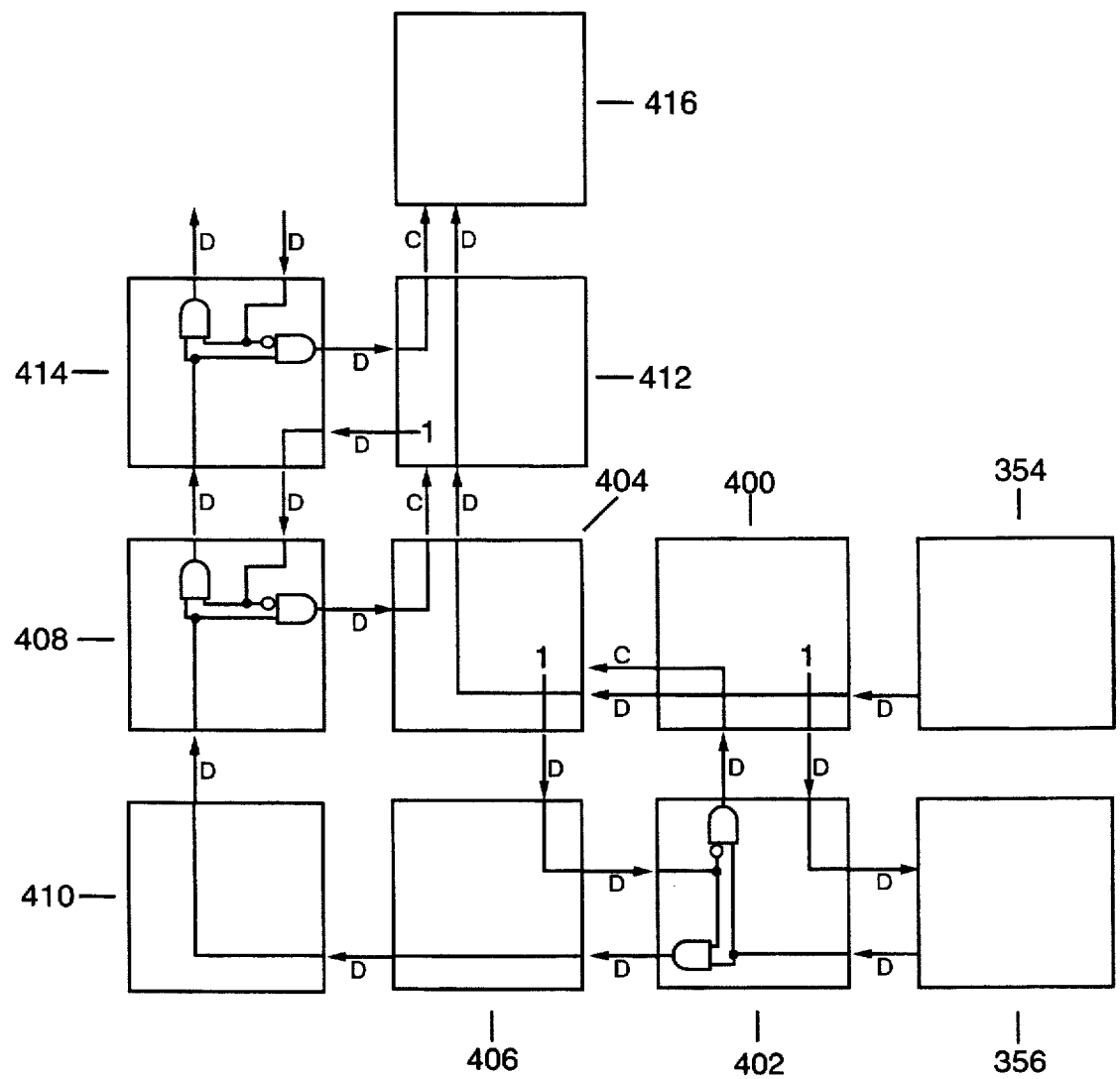
FIG. 17 illustrates an extendible wire which achieves a 90-degree turn in its orientation.

FIG. 17 shows an extendible wire which is not linear. In this configuration, initial PC cell 354 and initial CC cell 356 again control the program and control channels, respectively, of the two-channel wire. Cells 400 and 402 are configured exactly like cells 358 and 360 in FIG. 12. However, cells 404, 406, 408 and 410 collectively implement a corner in the two-channel wire. In this configuration, cells 404 sends a 1 to its DS output, which cell 406 routes to its DE output, which prevents cells 402 and 400 from acting as head cells. Cells 406, 410 and 408 pass the control channel signal from cell 402's DW output to cell 408's DN output. Cell 404 passes the program channel signal from its DE input to its DN output. Note that it is cell 404's DS output of 1 which actually moves the head of the wire from cells 400 and 402 to cells 404 and 408.

Cells 412 and 415 show two additional cells, configured to the north of cells 404 and 408, respectively, to act as the final head cells of the wire. Cell 412 outputs a 1 to its DW output, which cell 414 passes to its DS output, which prevents cells 408 and 404 from acting as head cells. Thus, in the configuration shown in FIG. 17, cell 416 is the target cell, whose DS and CS inputs are controlled by initial cells 354 and 356, respectively. The wire has been extended to the West, then made to corner to the North, and then extended to the North.

Similar configurations are easily generalized for corners from and to other directions, i.e., for an extension to the West followed by a corner to the South, and so on.

Note that in the wire of FIG. 17, PC cell 404's secondary connected input side (on its West) is different from its signaling output side (on its South). Moreover, CC cell 406 receives a 1 on its signaling input side (on its North), and transfers it to its feedback output side (on its East). However, cell 406 does not itself have a feedback input side, nor does it have a secondary connected output side. Instead, CC cell 408 has these sides. In such a complex wire, it is useful to speak not of a CC cell and a PC cell per se, but rather of a CC segment and a PC segment. In this case, cell 404 comprises a PC segment, while cells 406, 410 and 408 collectively comprise a CC segment. We can then speak of a PC segment's connected input side, connected output side, secondary connected input side, and signaling output side, as well as a CC segment's connected input side, connected output side, secondary connected output side, feedback input side and feedback output side. In general, terms such as "signal output side" may be applied to either a segment, or to the cell or cells within a segment which contain the indicated side.

Additional terminology may be applied here as well. Cell 404 can be called the signal PC cell (since it asserts a one to its signal output side). Similarly, cell 406 is the signal CC cell. These cells are the beginning of the segment (comprising cells 404, 406, 408 and 410). On the other end of the segment, cell 408 can be called the control CC cell. Cell 404 can also be called the control PC cell of the segment.

FIG. 17 contains three segments. Cell 400 comprises the first or initial PC segment, and cell 402 the first or initial CC segment. Cell 404 comprises the second PC segment, and cells 406, 410 and 408 comprise the second CC segment. Cell 412 comprises the third and last PC segment, and cell 414 comprises the third and last CC segment. Of course, notions such as "first" and "last" may be relative to where the cells sit within other larger structures.

Normally, a two-channel wire such as the one shown in FIG. 12 does not allow information to be passed from one side of the wire to another. In a three-dimensional matrix, this may not be a problem, since additional wires can be routed around the two-channel wire. On a two-dimensional matrix however, this can be a serious limitation. Then problem is, head cell 372 uses both its DN output and its DN input to communicate with head cell 370. Since such a two-channel wire is a contiguous collection of such head cells, there is no way to pass a signal between the region north of the wire and the region south of the wire.

Figure 18A:
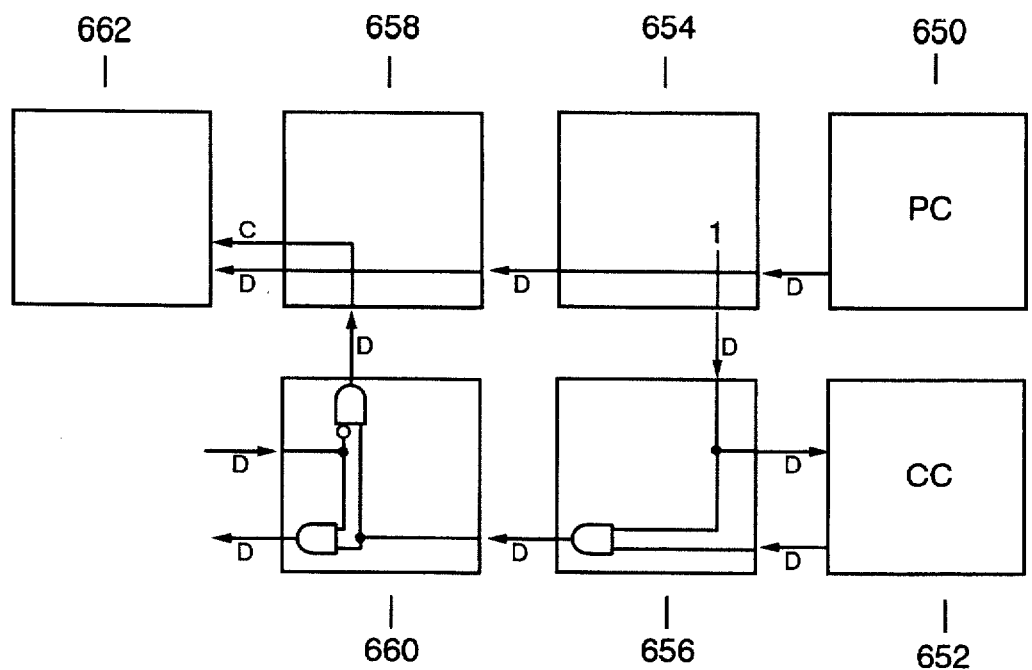
FIGS. 18A–18B illustrate a semi-crossable wire.

FIG. 18A shows a variation on the basic two-channel wire. This wire is designed to be partially crossable. Cells 650 and 652 control the PC and CC of the wire, cells 658 and 660 are the usual head cells, and cell 662 is the target cell. However, cells 656 and 654 have been added to the configuration. Collectively, cells 654 and 658 accomplish the usual function of the PC head cell, while cells 656 and 660 collectively accomplish the function of the CC head cell. The advantage of this configuration is that cell 656's DS input and DN output, and cell 654's DS input and DN output are all unused. This allows a signal to be routed from cell 656's DS input to cell 654's DN output, as shown in FIG. 18B.

Note that in FIG. 18A, until cell 654 is configured, cells 650 and 652 remain the head cells of the wire, and cell 654 remains the target cell. Cells 658, 660 and 656 can all be configured without changing the location of the target cell. When cell 654 is configured however, its DS output will be passed by cell 656 to cell 652's DW input, which deactivates head cells 652 and 650, while simultaneously moving the head of the wire to cells 660 and 658. Note also that an AND gate has been added to cell 656, to prevent the CC data from being sent to cell 660 until cell 654 is in its final configuration.

Figure 18B:
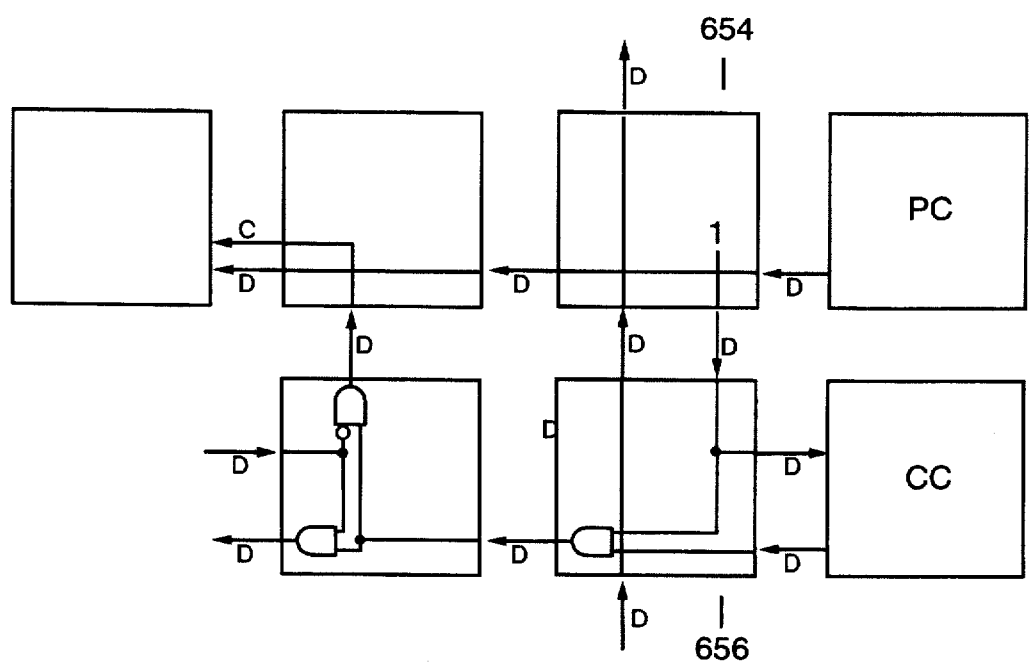

FIGS. 18A and 18B illustrate additional cases of complex wires. In FIG. 18A, cells 654 and 658 collectively make a PC segment, and cells 656 and 660 collectively make a CC segment. In this case, cell 654 has the PC segment's signal output side, while cell 658 has the PC segment's secondary connected input side. Cell 656 has the CC segment's signal input side, as well as the feedback output side, while cell 660 has the CC segment's secondary connected output side, as well as the feedback input side. Each of cells 654, 658, 656 and 660 has a connected input side and a connected output side. Moreover, in FIG. 18B, cells 654 and 656 are called passthrough cells, since they are used to pass information across the wire.

Figure 19A:
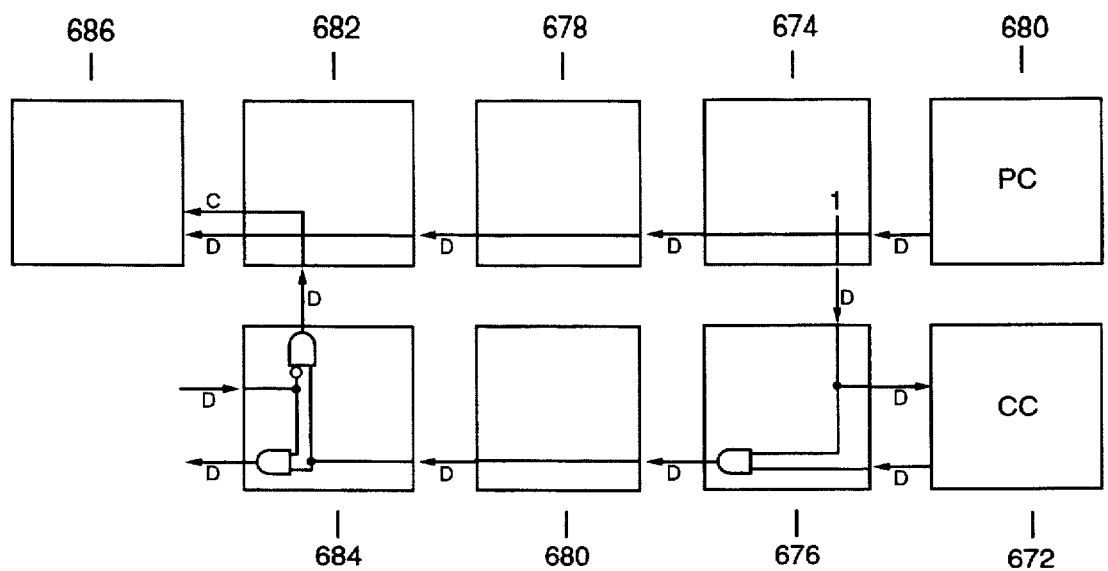
FIGS. 19A–19B illustrate a fully-crossable wire.
Figure 19B:
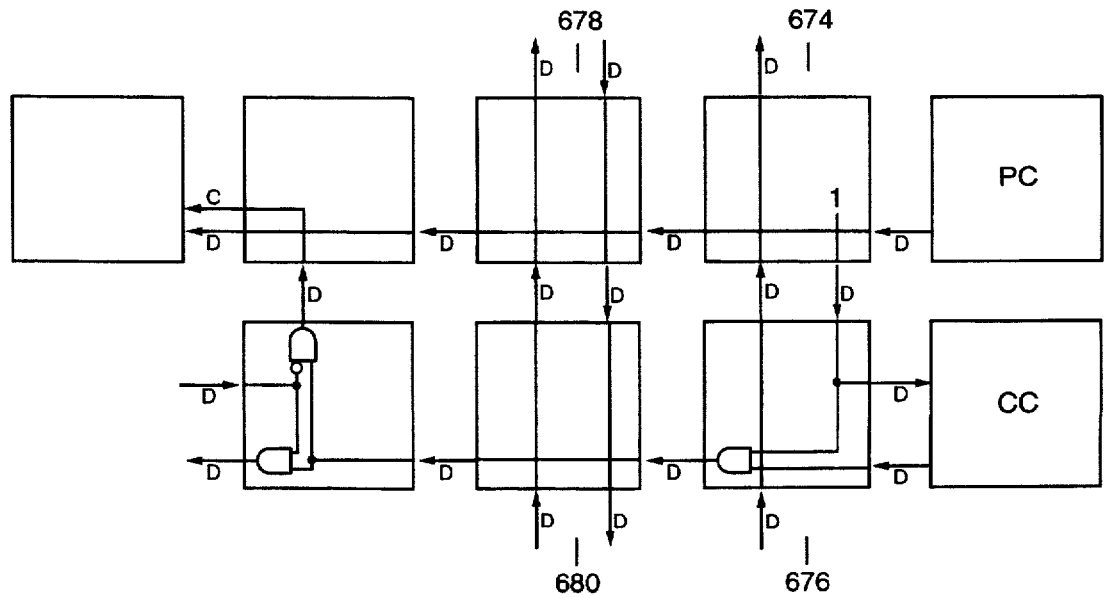

FIGS. 19A and 19B show another variation on a crossable wire. In FIG. 19A, cells 672 and 680 are the former head cells, cells 684 and 682 are the new head cells, and cell 686 is the new target cell. Cells 674 and 676 have been added, and are identical to cells 654 and 656 respectively in FIG. 18A. However, two additional cells have been added to the configuration. Cells 678 and 680 simply pass PC and CC data from their DE inputs to their DW outputs. However, neither of these cells use their DS or DN inputs or outputs. Cells 678 and 680 can therefore be used to pass data from one side of the wire to the other, as shown in FIG. 19B. Also, as in FIG. 18B, cells 676 and 674 can be used to route data in one direction. Again, note that in FIG. 19A, cells 680 and 672 remain the head cells of the wire until cell 674 is configured. Therefore, cells 682, 684, 678, 680 and 676 can be configured without changing the target cell. Only when cell 674 is configured does the head of the wire move, causing cell 686 to become the new target cell.

FIG. 19A further illustrates the notion of PC and CC segments. In this case, the signal output side of cell 674 is far removed from the secondary connected input side of cell 682. Note that there are additional cells 678 and 680 which possess only connected input sides and connected output sides, i.e., they are part of the segments but only serve to pass PC and CC data through their respective channels. Such cells are called connecting cells. In general, a PC and CC segment may contain zero or more such connecting cells. Similarly, in FIG. 17, cell 410 is a connecting cell within its CC segment. Also, note that the wire in FIG. 19B contains four passthrough cells: cells 678, 680, 676 and 674.

FIGS. 1–19 have shown primarily static configurations of cells, and have discussed their operations once they are configured. So far, however, little has been said about how such configurations come to be. In particular, multi-channel wires can be extended by replicating their head cells at the head of the wire, but it has not yet been described how such replications occur.

FIGS. 20A–20D shows a sequence of four wire-building steps for extending a basic two-channel wire. In each figure, target cell 438 is being controlled by initial PC cell 430 and initial CC cell 432 via the two channel wire consisting of head cells 434 and 436. The DW output of initial PC cell 430 is effectively connected to the DE input of target cell 438, while the DW output of initial CC cell 432 is effectively connected to the CE input of target cell 438. There is an implicit assumption that the target cell is initially empty, i.e., its configuration memory causes it to output 0 on all its outputs.

Figure 20A:
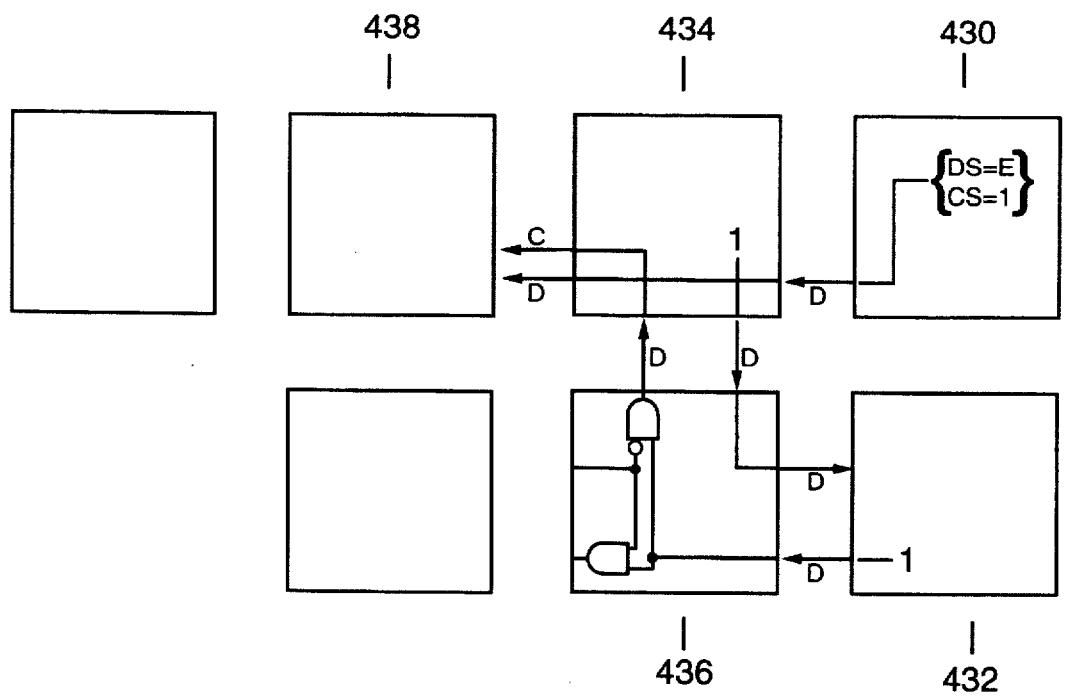
FIGS. 20A–20D illustrate a sequence of configuration steps for extending a two-channel wire.

In FIG. 20A, initial CC cell 432 is outputting a constant 1 to its DW output. This has the effect of constantly asserting a 1 to target cell 438's CE input, thereby placing target cell 438 into C-mode. Since target cell 438 is in C-mode via its CE input, target cell 438 repeatedly samples its DE input and loads the sampled bits into its own internal configuration memory. Therefore, the output bits sent through initial PC cell 430's DW output will be loaded into target cell 438's configuration memory.

The Boolean equations shown inside initial PC cell 430 in FIG. 20A correspond to the bits being sent from that cell. In this case, the equations are {DS=E and CS=1}. This indicates that the D output of initial PC cell 430 is being controlled to generate a bitstream which causes target cell 438's configuration memory to be loaded with the indicated Boolean equations (i.e., cell 438 will be configured so that, upon its return to D-mode, it will begin executing the given Boolean equations). Therefore, after one complete programming cycle, target cell 438's configuration memory has been loaded with the necessary bitstream to implement those equations.

Note that in other versions of a cell matrix besides the one disclosed in U.S. Pat. No. 5,886,537, it may not be necessary to configure a cell for an entire programming cycle. One such version is disclosed in application Ser. No. 09/476,645 filed Dec. 31, 1999. In general, there are numerous possible protocols for loading truth tables into a cell, depending on the specifics of the cell matrix implementation. Such variations are, however, unimportant in what follows, since we will describe the generation of bitstreams in terms of Boolean equations which a target cell should execute, rather than in terms of specific patterns of ones and zeros.

Figure 20B:
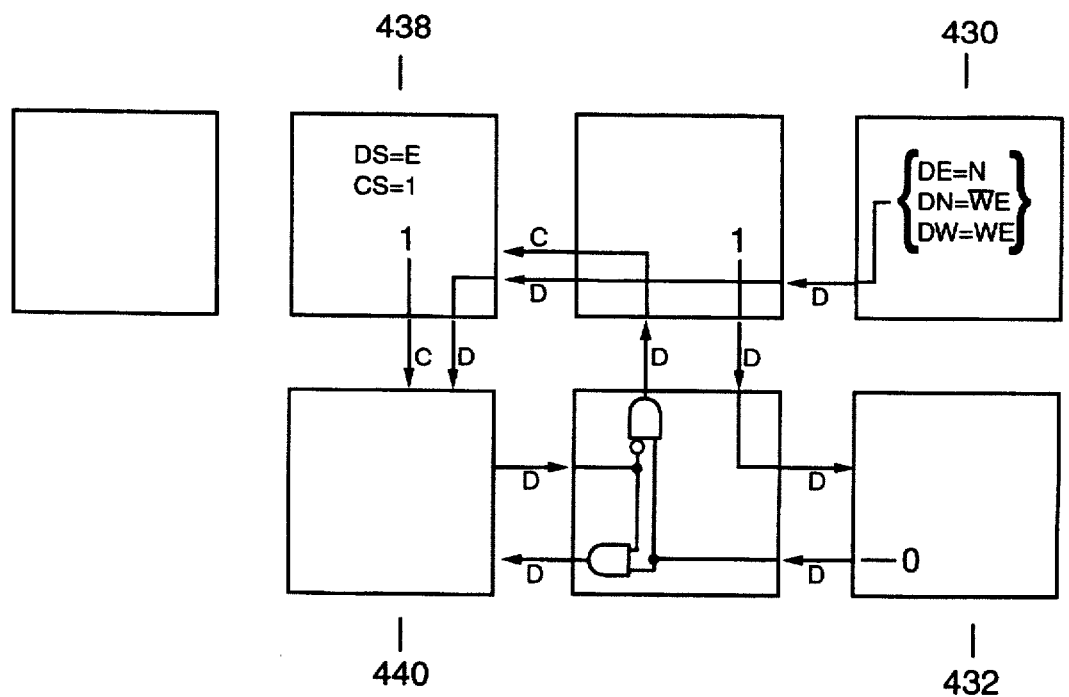

FIG. 20B shows the configuration after one complete programming cycle. Initial CC cell 432 is now outputting a constant 0, which means target cell 438's CE input is 0, so target cell 438 is now in D-mode, and is therefore executing the truth table stored in its configuration memory. Since target cell 438's configuration memory was previously loaded with the equations {DS=E and CS=1} in FIG. 20A, target cell 438 now begins executing those equations. This is shown schematically in FIG. 20B.

Since target cell 438 implements the equation DS=E, it passes its DE input to its DS output, which is the DN input of cell 440. Additionally, target cell 438 is outputting a 1 to its CS output, which is cell 440's CN input. Cell 440 is therefore in C-mode, and will load bits sent into its DN input into its internal configuration memory. Thus the bits sent from initial PC cell 430's DW output will be loaded into cell 440's configuration memory.

As indicated in FIG. 20B, initial PC cell 430 is outputting the equations {DE=N, DN=(!W)E, DW=WE} to its DW output. These equations are therefore loaded into cell 440's configuration memory.

Figure 20C:
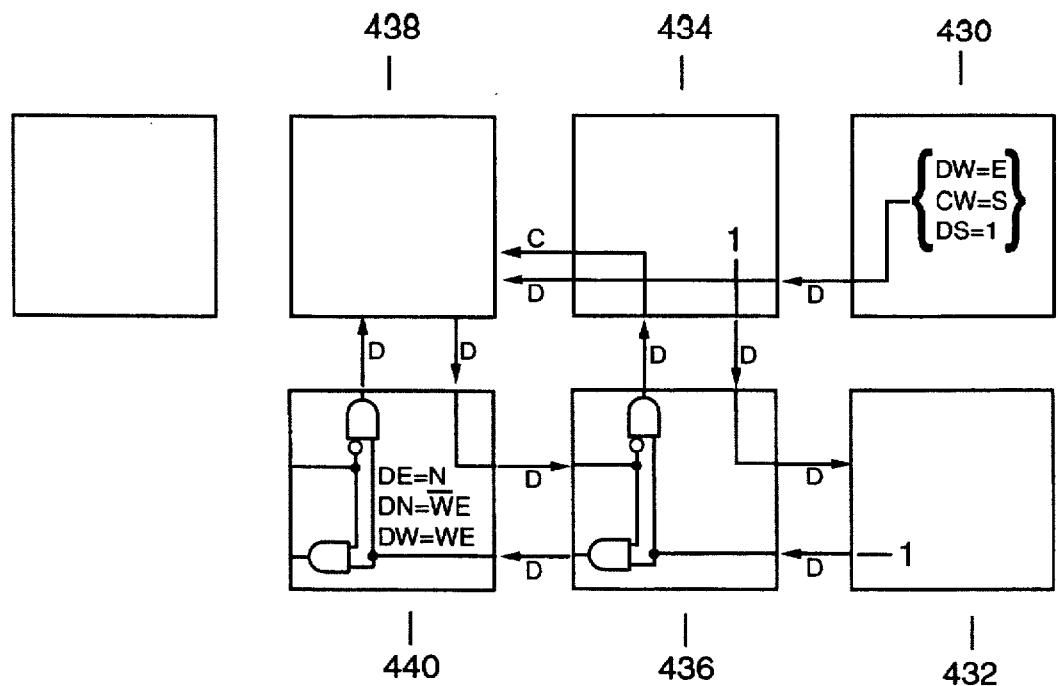

In FIG. 20C, initial CC cell 432 is again outputting a constant 1 to its DW output, which is delivered to target cell 438's CE input. This places cell 438 into C-mode, which causes all of target cell 438's C outputs to be driven to 0. Since target cell 438's CS output is thus driven to 0, cell 440 returns to D-mode, and thus begins executing the truth table stored in its configuration memory. This is shown schematically by the diagram inside cell 440 in FIG. 20C. Additionally, since target cell 438 is in C-mode and its CS input is 0, its DS output is also driven to 0. Thus cell 440 will pass a 0 to head cell 436's DW input, causing head cells 434 and 436 to continue finctioning as head cells of the wire. Moreover, cell 436 will not pass its DE input to its DW output, again because its DW input is 0. Therefore, cell 440, while configured the same as a head cell, will not yet act as a head cell. Finally, since target cell 438 is again in C-mode, bits sent to its DE input are loaded into its configuration memory. Initial PC cell 430 is outputting the bitstream corresponding to the equations {DW=E, CW=S and DS=1}.

Figure 20D:
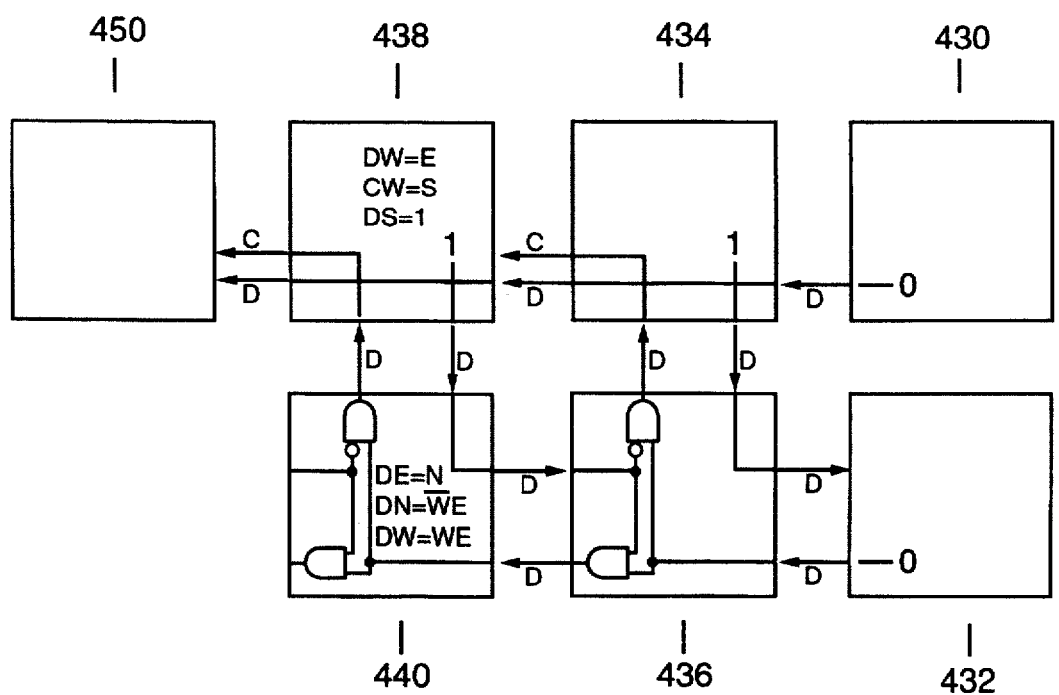

In FIG. 20D, initial CC cell 432 is again outputting a constant 0 to its DW output, which means target cell 438 is again in D-mode, and thus executes the truth table stored in its configuration memory. In particular, it begins acting exactly like head cell 434, since it is programmed with the same equations. It is outputting a 1 to its DS output, which cell 440 passes to its DE output, which causes head cells 434 and 436 to be deactivated as head cells. Simultaneously, cells 438 and 440 now begin acting as new head cells of the wire, and new target cell 450 is now the new target cell. The wire has been extended, and initial PC cell 430 and initial CC cell 432 now collectively control new target cell 450.

Figure 21:
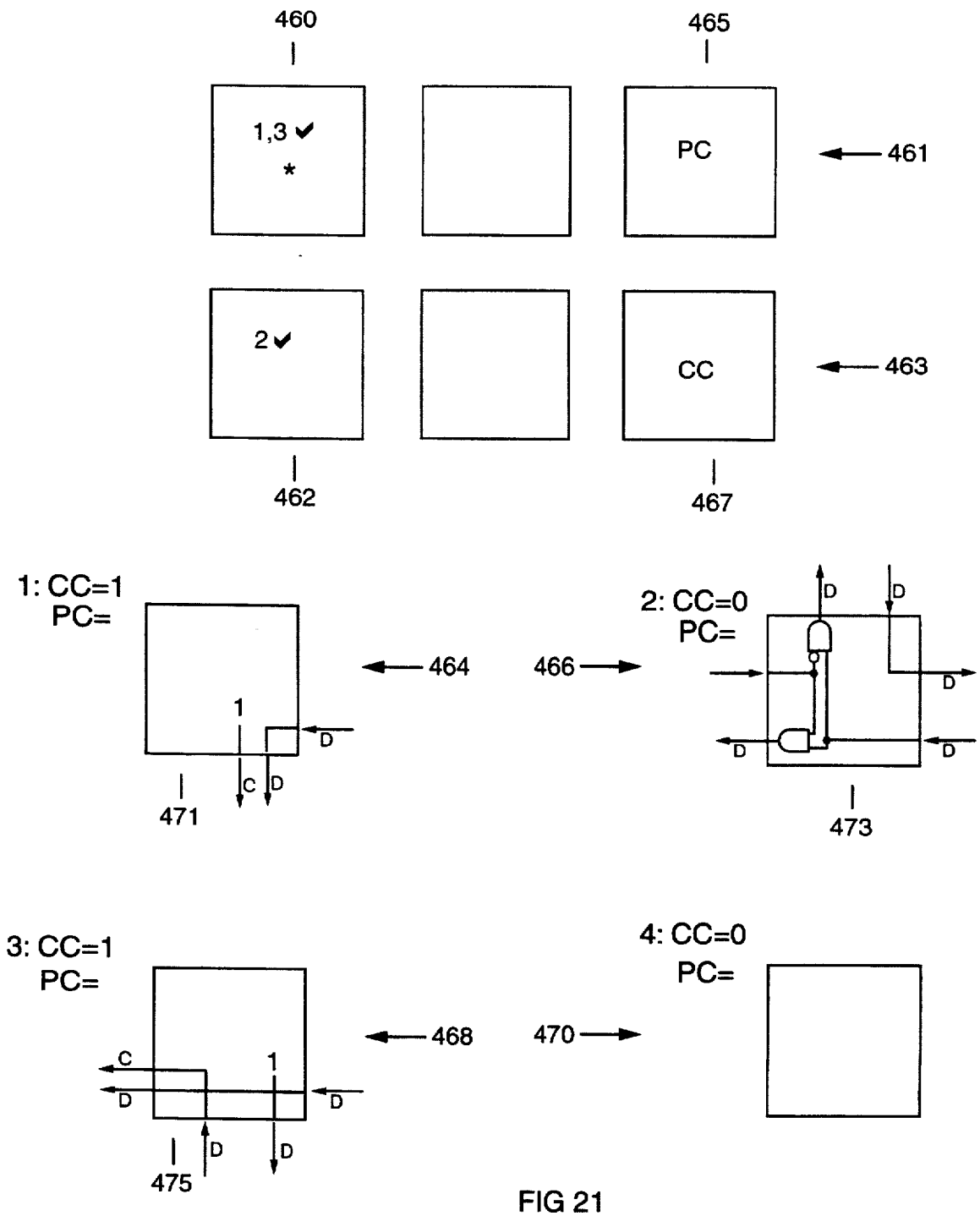
FIG. 21 illustrates the sequence of FIGS. 20A–20D in a shorthand notation.

Synthesis of circuits using wires generally follows a sequence of steps similar to those shown in FIGS. 20A–20D. In general, an initial CC cell and an initial PC cell will generate a pair of bitstreams, called the CC bitstream and the PC bitstream respectively. FIG. 21 illustrates a shorthand notation for describing such a sequence of configuration steps. FIG. 21 corresponds to the sequence of steps shown in FIGS. 20A–20D. In addition to requiring less space, this shorthand also serves to highlight only the critical pieces of each step, thereby making it easier to understand complex configuration sequences.

In FIG. 21, 461 and 463 correspond to the Program Channel (PC) and Control Channel (CC) respectively of the initial two-channel wire. Initial PC cell 465 is labeled "PC" to indicate that it is sending bits into the PC of the wire, while initial CC cell 467 is labeled "CC" to indicate that it is sending bits into the CC of the wire.

Cell 460 is identified as the initial target cell of the wire by the "*" inside it. Cells 460 and 462 are configured in subsequent steps, as indicated by the numbers inside them. Cell 460 contains a "1" indicating it is configured in step 1 of the configuration sequence. Cell 462 is configured in step 2. Additionally, the checkmark next to the "2" in 462 indicates that after step 2, cell 462 will be in its final configuration. Similarly, cell 460 is configured in step 3, and is then in its final configuration.

464, 466, 468 and 470 illustrate the details of each step in the four-step configuration sequence. 464 indicates that in step 1, the value sent along the CC of the wire is 1, while the values sent along the PC of the wire are the bits corresponding to a truth table which realizes the function indicated by 471. 466 illustrates step 2 of the sequence, where 0 is sent along the CC and the truth table bits corresponding to 473 are sent along the PC. 468 illustrates step 3, where CC=1 and PC corresponds to the function illustrated by 475. 470 indicates the fourth and final step of the sequence, where CC=0 and PC=0. Note that there is no additional configuration performed in step 4, but it is necessary to return the CC to 0 for the head of the wire to actually move.

This shorthand will be used to explain the remaining sequences.

Figure 22A:
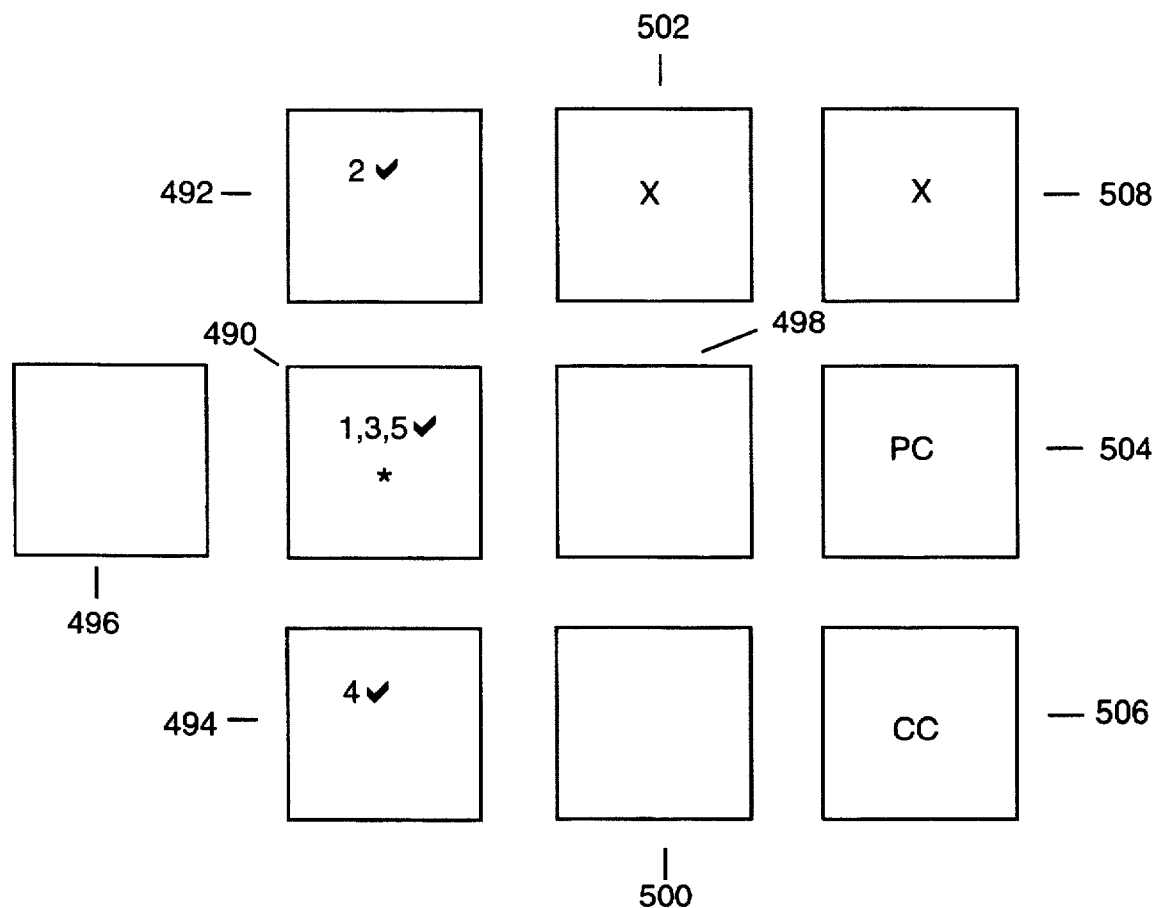
FIGS. 22A–22B illustrate a sequence for extending a three-channel wire.
Figure 22B:
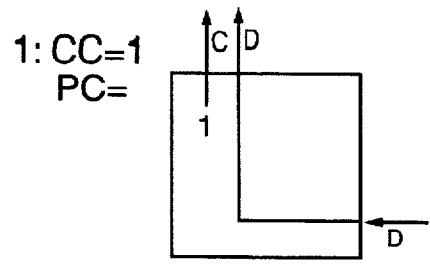
Figure 22B:
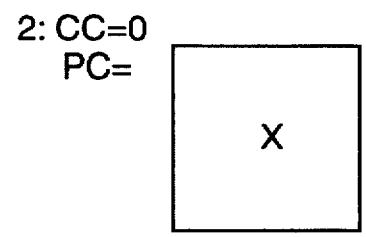
Figure 22B:
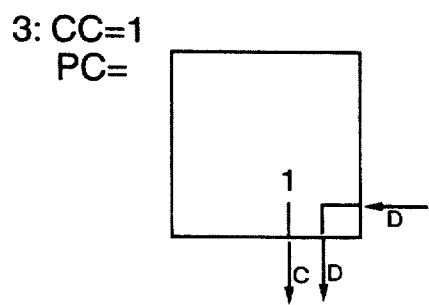
Figure 22B:
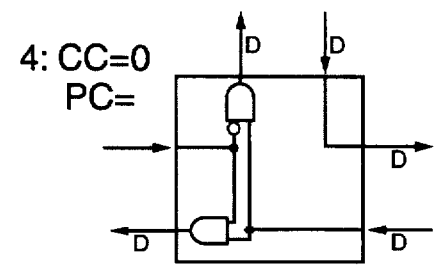
Figure 22B:
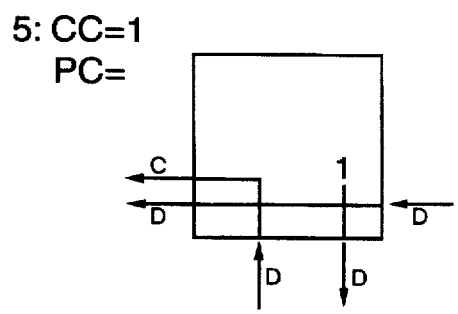
Figure 22B:
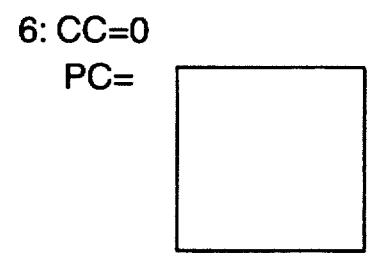

FIGS. 22A and 22B illustrate a sequence for extending a 3-channel wire. In the initial configuration, target cell 490's DE and CE inputs are controlled by initial PC cell 504 and initial CC cell 506 respectively. Cells 498 and 500 are the head cells of the wire. Cell 502 is part of a third channel to the North of the basic two-channel wire. This third channel is controlled by cell 508.

In step 1, target cell 490 is configured to allow configuration of cell 492. In step 2, cell 492 is configured with some truth table (represented by "X") to cause it to function as part of the third channel containing cells 502 and 508. Note that this configuration is achieved via the step 1 configuration of target cell 490. In step 3, target cell 490 is again configured, this time to allow configuration of cell 494 to its south. In step 4, cell 494 is configured with its final truth table, again via target cell 490. In step 5, target cell 490 is configured with its final truth table. Step 6 is the final return of the CC to 0. After this 6-step sequence, the three-channel wire has been extended, and cell 496 is the new target cell.

Figure 23A:
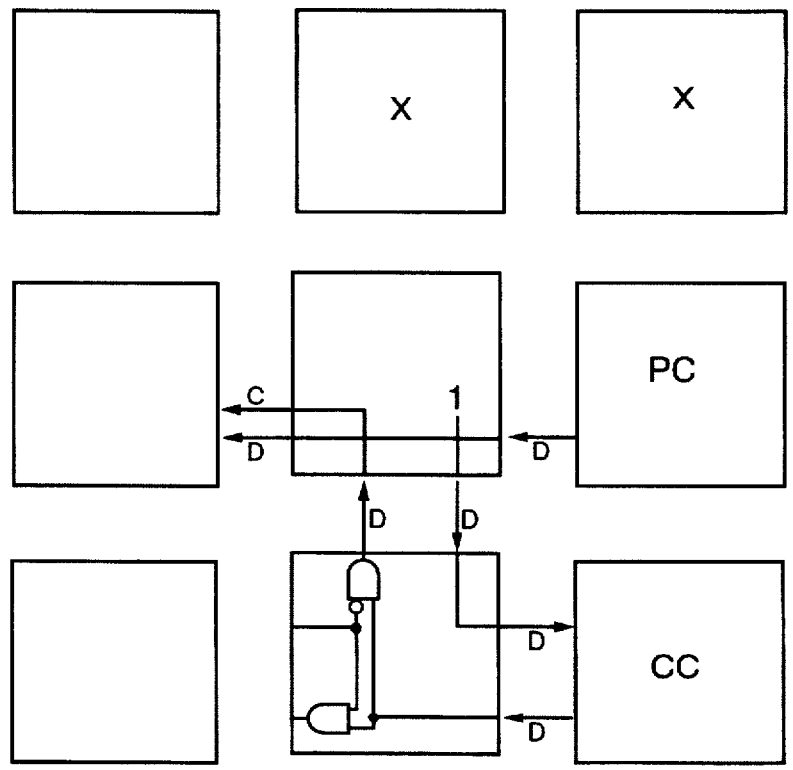
FIGS. 23A–23B illustrate a three-channel wire before and after extension.
Figure 23B:
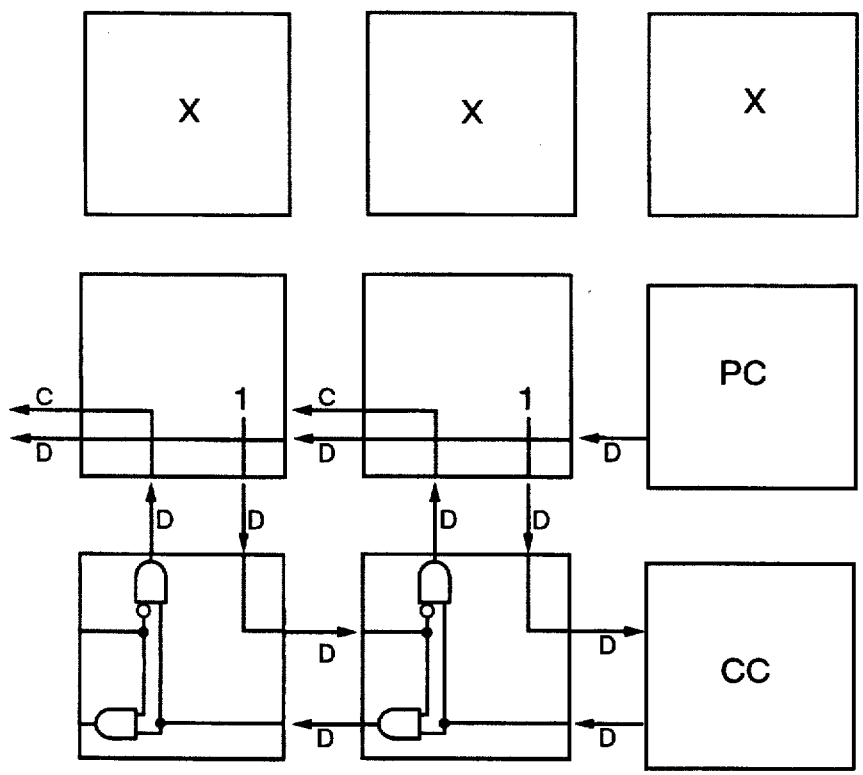

For further illustration, FIG. 23A shows the initial configuration of cells before this sequence, and as FIG. 23B shows the final configuration.

Note that this sequence can be used regardless of what the third channel of the wire is being used for. It does not matter if it is configured to act as a simple data conduit, or as a break line, or as something else.

Figure 24A:
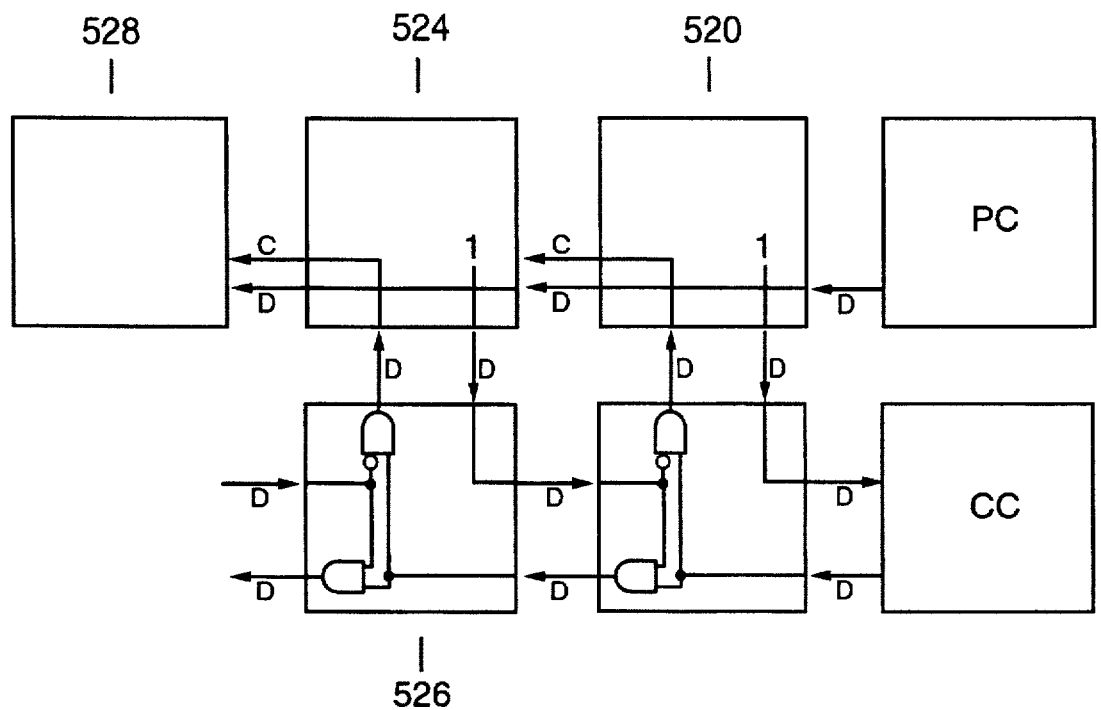
FIGS. 24A–24C illustrate a potential problem with using a break line.
Figure 24B:
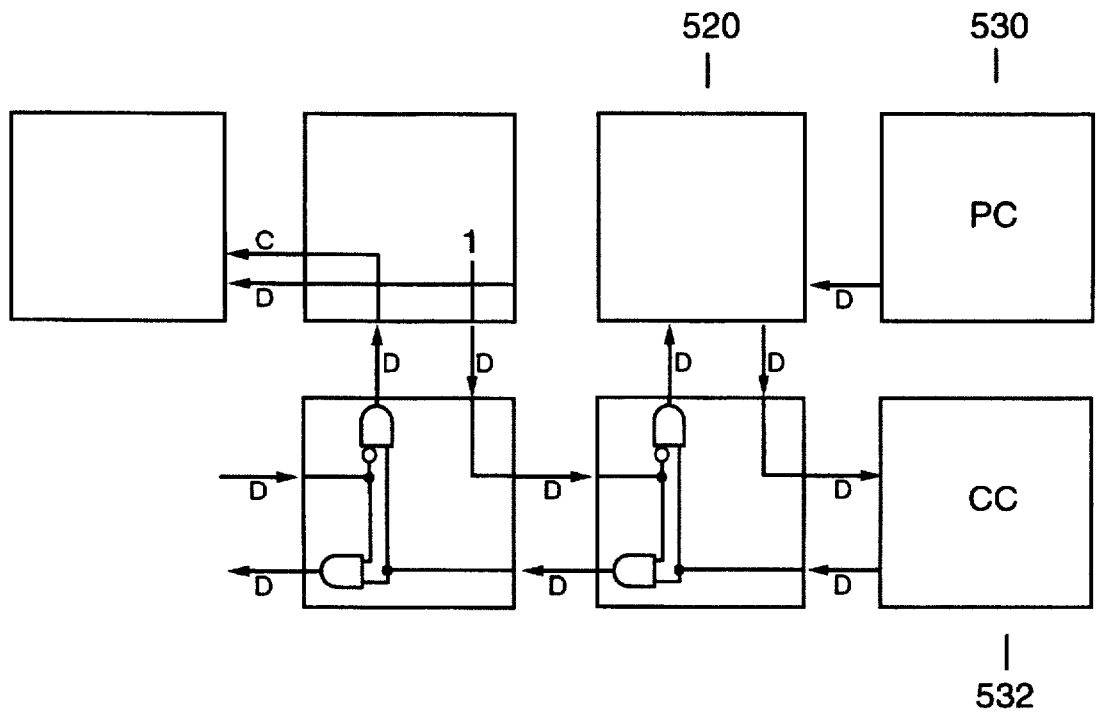
Figure 24C:
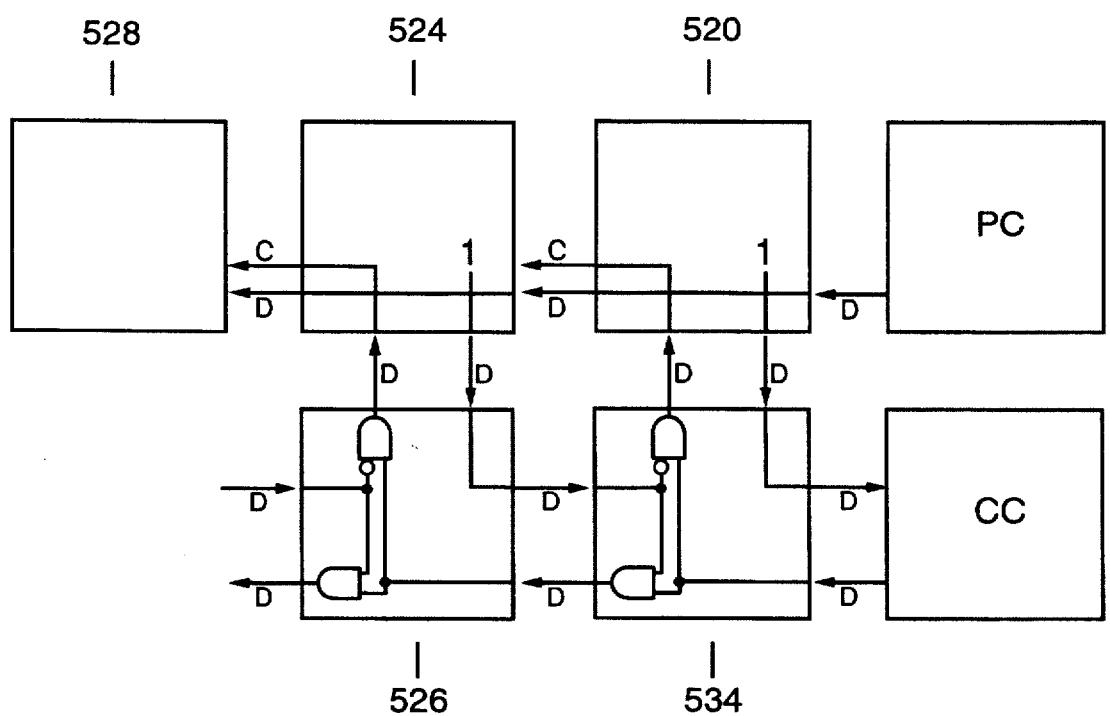

FIGS. 24A–C show a potential problem with extending wires. In FIG. 24A, cell 528 is the target cell of a two-channel wire, and cells 524 and 526 are the head cells of the wire. Suppose there is a break wire sitting to the north of the PC, and that break wire is used to erase cell 520 (i.e., set its truth table to all 0s). The result is shown in FIG. 24B. In this figure, cells 530 and 532 are the new head cells of the wire, and cell 520 is the new target cell. However, if cell 520 is now configured to act as a head cell, the new configuration will be as in FIG. 24C, which is exactly the same as in FIG. 24A. Cell 524 will not be the new target cell. Instead, cells 524 and 526 will act as new head cells, and cell 528 will again be the target cell. In other words, even though the wire has been broken in FIG. 24B, simply reprogramming cell 520 as a head cell causes the entire original wire to be restored.

The problem is that, in FIG. 24B, configuring cell 520 decommissions head cells 530 and 532, but it does not explicitly determine where the new head cells will be located. The location of the new head cells depends on the configuration of cells to the west of former head cells 530 and 532. In the case shown in FIG. 24C, cell 524 is outputting a 1 to is DS output, which causes cells 520 and 534 to also be decommissioned as head cells. To avoid this, cell 524 must be pre-cleared prior to configuring cell 520 as a head cell.

Figure 25A:
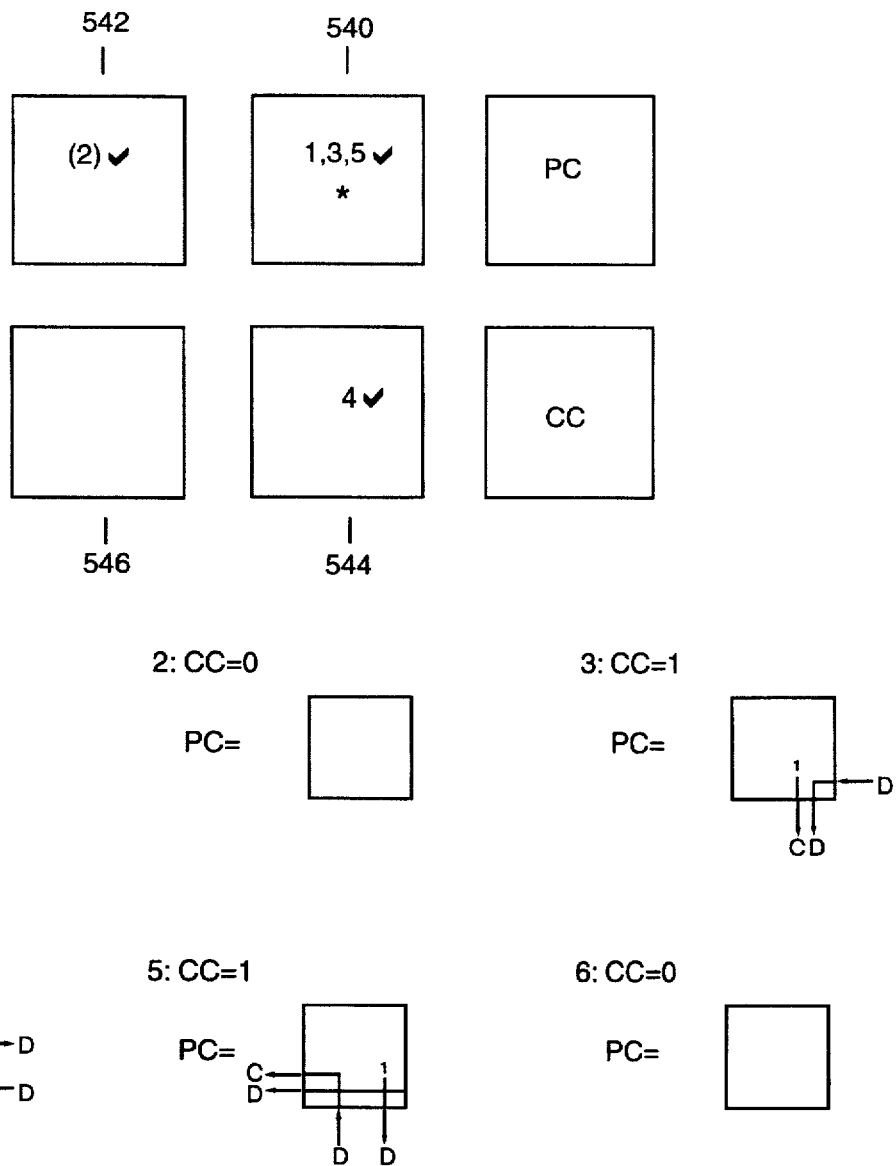
FIGS. 25A–25B illustrate solutions to the problem shown in FIGS. 24A–24C.

FIG. 25A illustrates a wire extension sequence which includes a pre-clear step to avoid this problem. Suppose that initially cells 542 and 546 are configured as head cells, but that cell 540 has been cleared by a break line. Target cell 540 is then the actual target of the wire. A six-step sequence can now be used to extend the wire.

In step 1, target cell 540 is configured to clear cell 542. In step 2, cell 542 is cleared. This is indicated by the parenthesis around the 2 "(2)" inside cell 542, indicating that cell 542 is configured in step 2, but that its resulting configuration is all 0s. Additionally, the checkmark indicates this is the final configuration of cell 542. Note that prior to this step, cell 542 will have been outputting a 1 to its DS output. After cell 542 is cleared, it will then be outputting a 0 to its DS output.

Steps 3–6 are the same as for a normal two-channel wire extension. Cell 544 is configured in step 4, and cell 540 is configured in step 5.

After step 6, cells 540 and 544 have been configured to act as new head cells, and cell 542 will be the new target cell, since if cell 546 is routing its DN input to its DE output, it will now route a 0 from its DN input to its DE output.

Figure 25B:
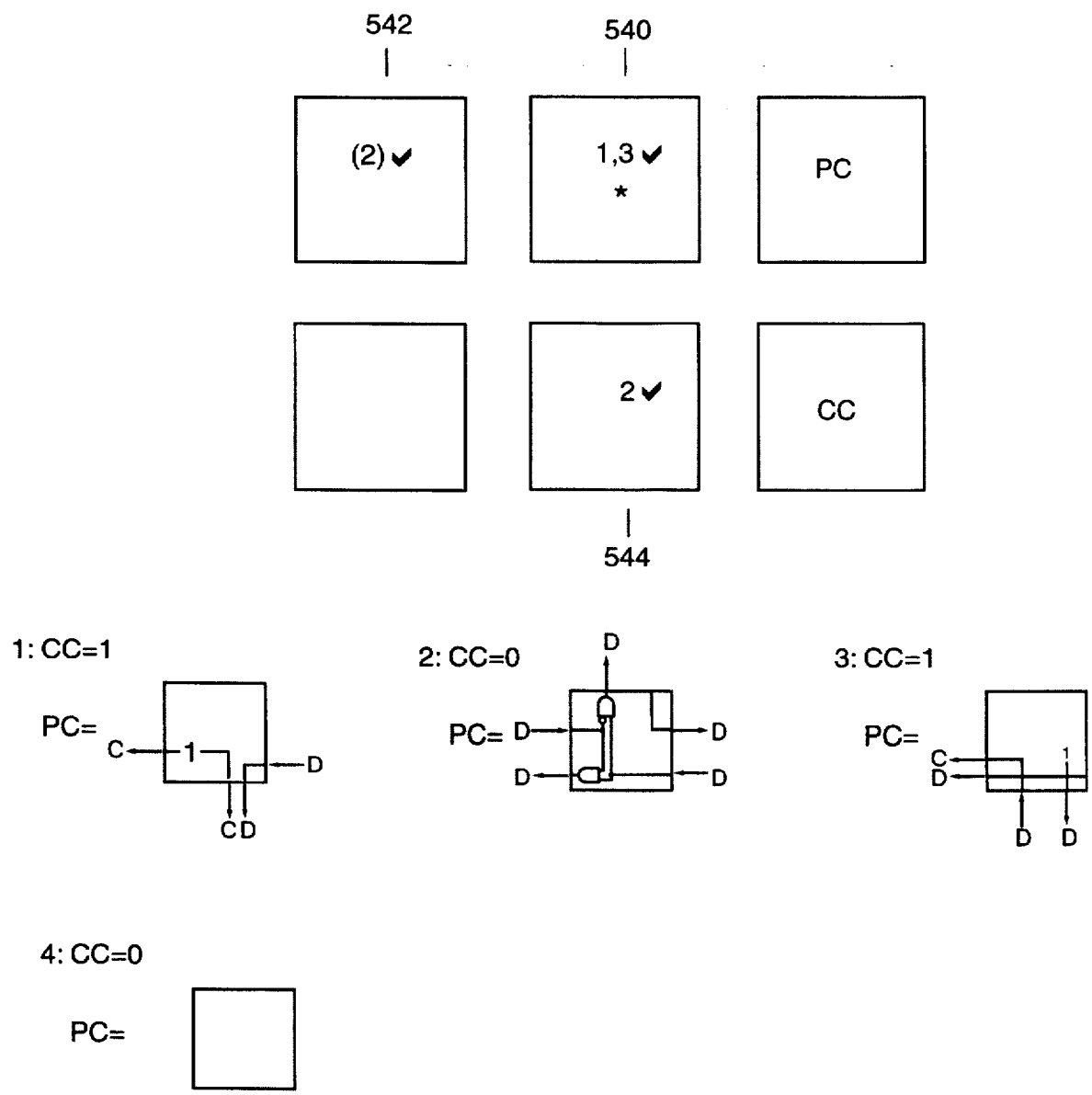

FIG. 25B shows a four-step sequence which achieves the same result. In this sequence, cell 542 is cleared in the same step that cell 544 is programmed. By the time cell 544 is placed in its final configuration (at the beginning of step 3), cell 542 has been cleared, and cells continues to be the target cell. Only after step 3 is completed and step 4 begins does the target cell change to cell 542.

Figure 26A:
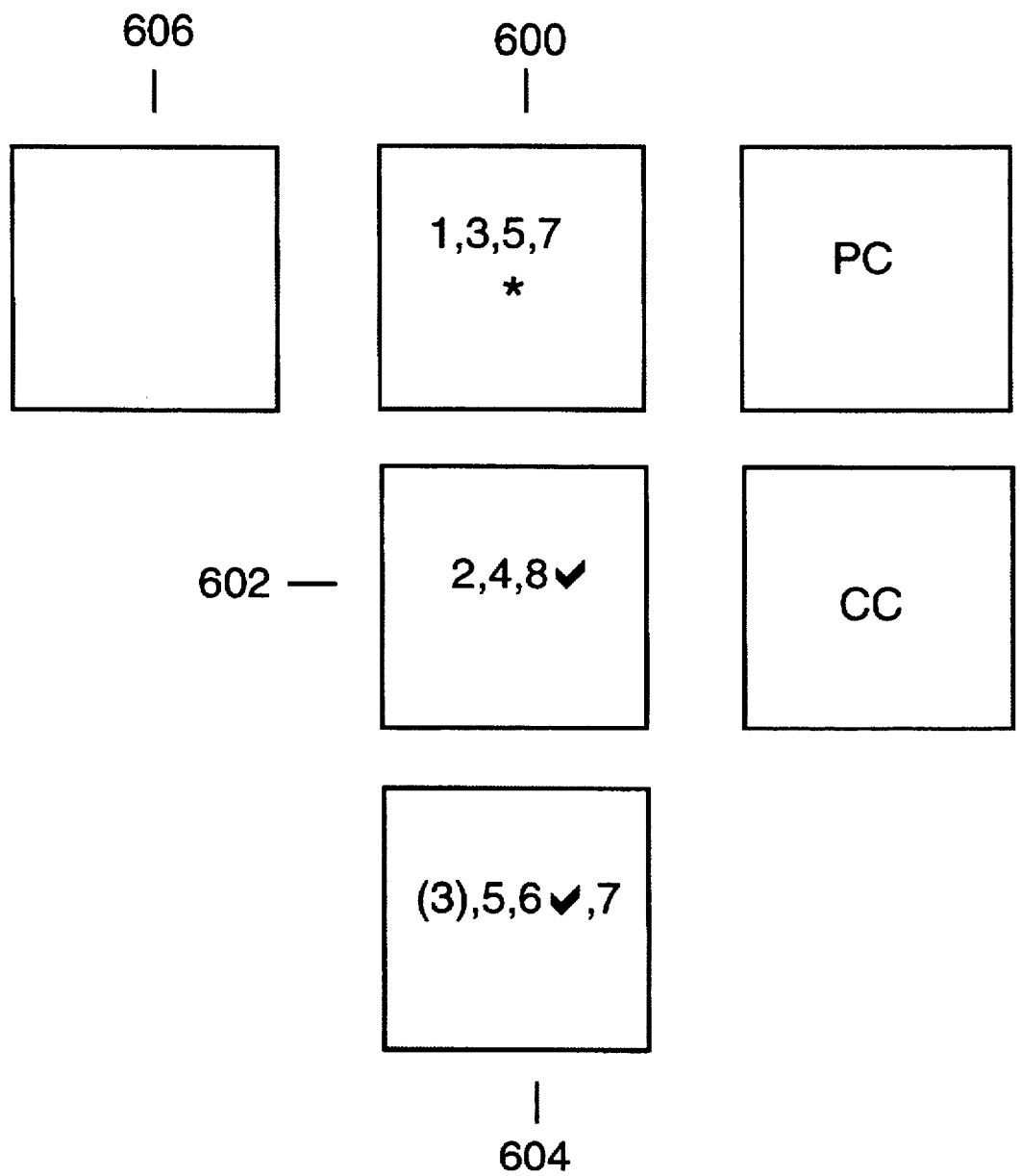
FIGS. 26A–26B illustrate a sequence of configuration steps for configuring a cell which is not adjacent to the target cell of a wire.
Figure 26B:
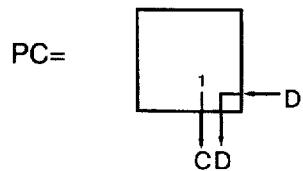
Figure 26B:
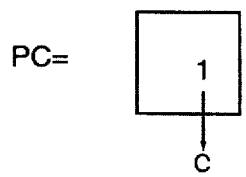
Figure 26B:
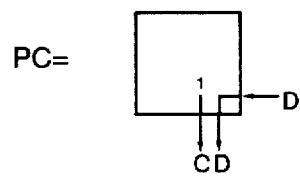
Figure 26B:
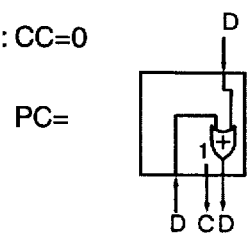
Figure 26B:
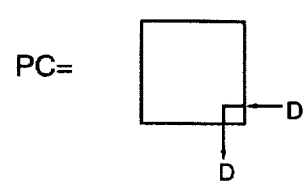
Figure 26B:
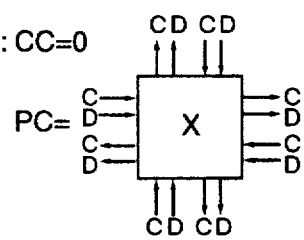
Figure 26B:
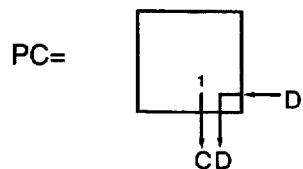
Figure 26B:
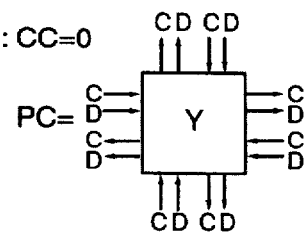

The sequence presented in FIG. 22 allows a third channel to be built to the north of the PC of a two-channel wire. However, this sequence took advantage of the fact that the cells of the third channel were adjacent to the target cells of the wire. It may be desirable to configure cells which are not adjacent to the target cell, but are instead one-cell removed. FIGS. 26A and 26B illustrate an 8-step sequence for achieving this.

In FIG. 26A, target cell 609 is directly configurable by the PC and CC, and can be used to configure cell secondary target cell 602. However, tertiary target cell 604 is non-adjacent to target cell 600. While target cell 600 has no direct access to cell 604, cell 602 is adjacent to cell 604, and can therefore be used to configure cell 604.

The main key to configuring cell 604 is in steps 4 and 6. In step 4, cell 602 is configured to allow its DN input to affect its DS output, and to place cell 604 into C-mode, thereby controlling cell 604's new configuration. In step 6, the final truth table (X) for cell 604 is sent into cell 602's DN input, where is it passed to cell 604's DN input. There are two additional things to note here.

First, after step 4, cell 602 is not simply routing its DN input to its DS output. Instead, it is ORing its DN and DS inputs to produce its DS output. This is done because, in step 7, cell 600 will be configured, and will therefore output 0s to its DS output, which cell 602 will receive on its DN input. If cell 602 simply passed its DN input to its DS output, cell 604 would be cleared in step 7. By ORing its DN and DS inputs, cell 602 can set bits in cell 604's truth table, but can not clear them. Thus, in step 7, when cell 602 is receiving 0s through its DN input, it reads cell 604's current truth table configuration and re-circulates it back into cell 604's truth table, thereby leaving cell 604 unchanged.

The other thing to note is that since, as configured in step 4, cell 602 can only set bits in cell 604's truth table, cell 604 needs to be initially cleared. In step 2, cell 602 is configured to clear cell 604. In step 3, cell 600 is placed in C-mode, which causes cell 602 to return to D-mode, and thereby assert its CS output. Since cell 602's DS output is 0, cell 604 is configured with all 0s in step 3. Note that in step 3, cell 600 is configured with exactly the same configuration as in step 1. Thus step 3 does not change the configuration of cell 600. It is, however, and important step, in that it places cell 600 into C-mode, thereby causing cell 600's CS output to be driven to 0 (and thereby allowing cell 602's CS output to be asserted).

The full sequence is thus as follows. Step 1 configures cell 600 to configure cell 602. Step 2 configures cell 602 to pre-clear cell 604. Step 3 allows the pre-clear to happen. Step 4 configures cell 602 as an ORing circuit. In step 5, cell 600 is configured to pass PC data to its DS output, which cell 602 will send to cell 604. In step 6, cell 604 is actually configured with its final truth table "X." In step 7, cell 600 is again configured to configure cell 602. In step 8, cell 602 is configured with its final truth table "Y."

In a typical scenario, step 8 and subsequent steps would be used to create new head cells out o cells 600 and 602 and move the target cell from cell 600 to cell 606. Regardless of such subsequent steps, the sequence shown in FIGS. 26A and 26B can be used to configure cells which are non-adjacent to the wire's target cell.

Description and Operation—Second Embodiment

Figure 27:
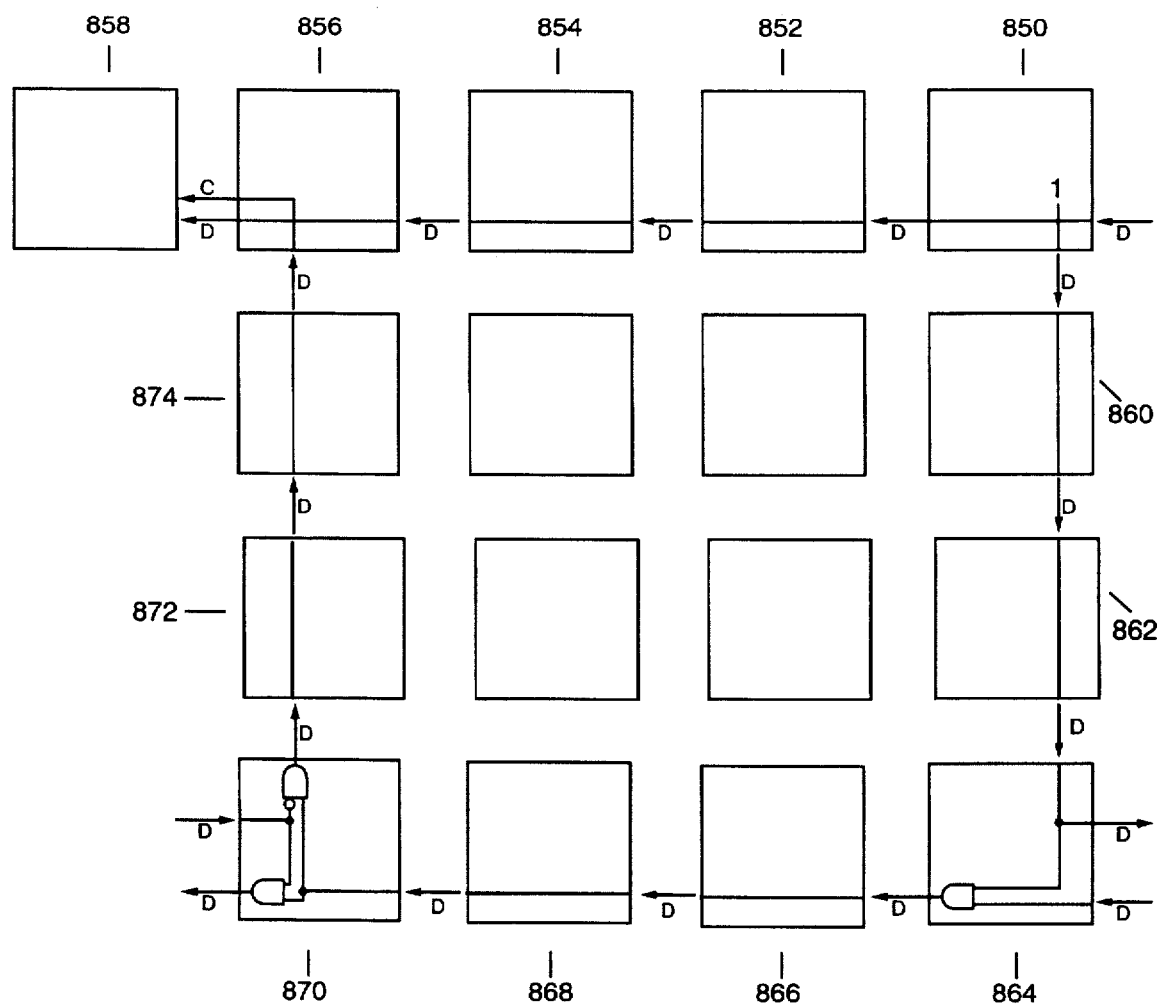
FIG. 27 illustrates a more general embodiment of a two-channel extendible wire.

There are many possible variations on the configurations and sequences shown in FIGS. 1–26B. For example, FIG. 27 shows a more general version of an extendible wire. Cells 850, 852, 854 and 856 collectively comprise a PC segment of the wire. Cells 864, 866, 868 and 870 comprise a CC segment. Cells 860, 862, 874 and 872 are called connecting cells, and allow the PC and CC segments to communicate with each other. Cell 858 is the target cell of this wire.

The wire functions the same as the wire shown in FIG. 19A, except for the presence of the connecting cells.

However, this wire has the additional advantage that cells 860, 874, 862 and 872 can now be used as passthrough cells for transmitting information along cells situated between the PC and CC of the wire.

In FIG. 27, cell 850's South side is the signal output side of the segment, while cell 864's North side is the signal input side. Cell 864's East side is the feedback output side, while cell 870's West side is the feedback input side. Cell 856's South side is the secondary connected input side, and cell 870's North side is the secondary connected output side of the segment.

Accordingly, cell 850 is called the signal PC cell, and cell 864 the signal CC cell. Cell 856 is called the control PC cell, and cell 870 the control CC cell. Again, cells 850, 852, 854, 856, 864, 866, 868 and 870 each have a connected input side and a connected output side on their East and West sides, respectively.

Note that there are other variations possible on this basic wire. For example, in a three-dimensional cell matrix, the signal output side and secondary connected input side of a one-cell PC segment could be on different sides of the cell, i.e., the PC and CC cells may be adjacent to each other, and may share their secondary connected input side and secondary connected output sides, respectively, but may have non-adjacent signal output and signal input sides.

Figure 28:
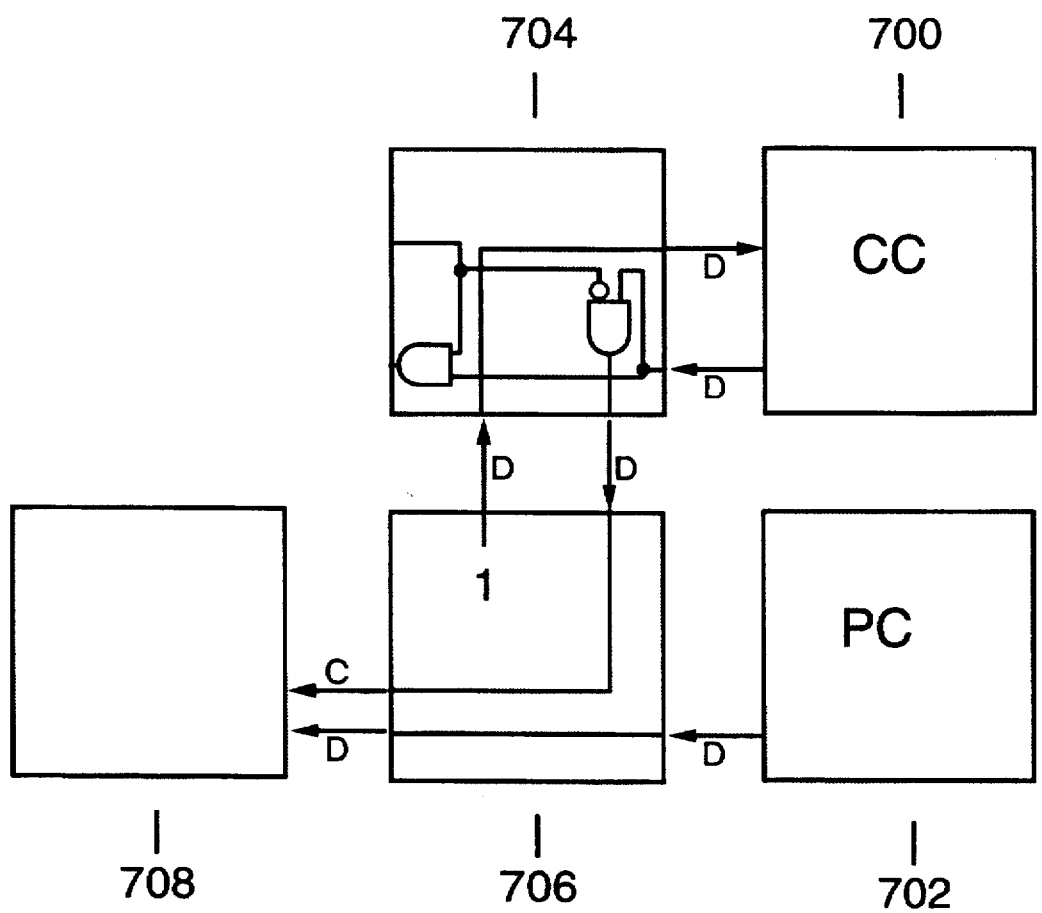
FIG. 28 illustrates another embodiment of a two-channel extendible wire.

Still other variations are possible. FIG. 28 shows a two-channel wire where the CC is located to the North of the PC. In this case, initial CC cell 700 controls the CC while initial PC cell 702 controls the PC. Cells 704 and 706 are the current head cells, and cell 708 is the current target cell. The operation of the wire is functionally identical to the wires described in the first embodiment. Only the relative locations of cells have changed.

More generally, wires can be run in any desired direction. Cells are symmetric with respect to rotation and reflection, i.e., there is nothing distinct about I/O lines on any one side vs. any other side. Therefore, by transforming the configuration of each cell and the cells' relative orientation to each other, any of the circuits presented above can be transformed.

Figure 29:
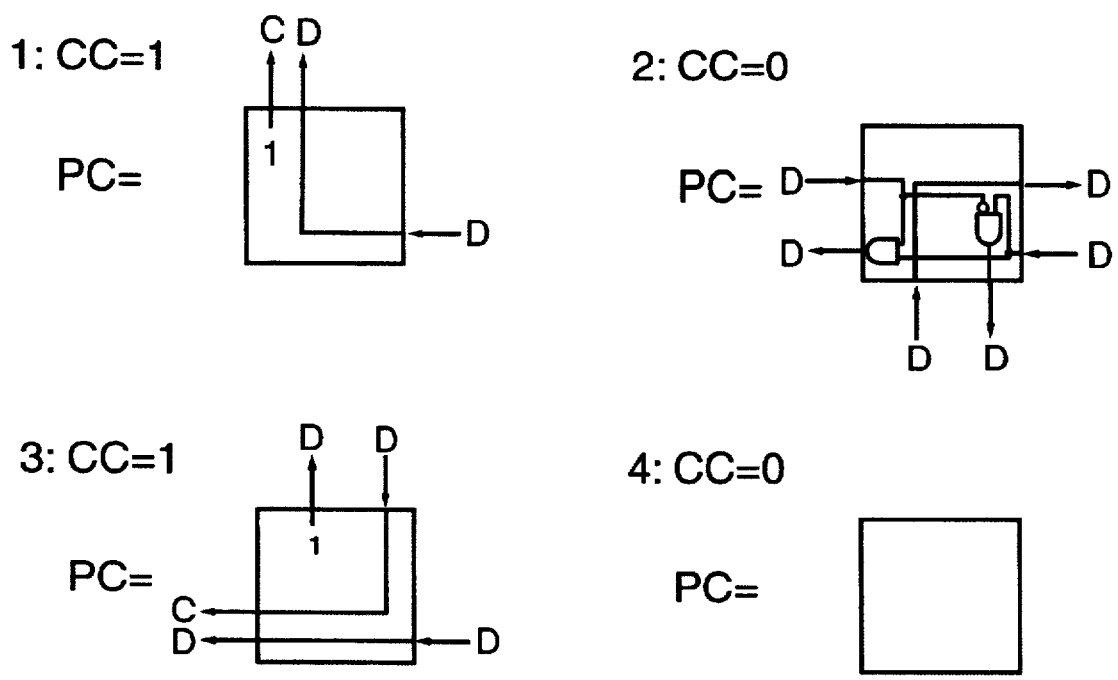
FIG. 29 illustrates a sequence of configuration steps for extending the wire in FIG. 28.

Similarly, the configuration operations described above are independent of orientation. FIG. 29 shows the steps for extending the two-channel wire of FIG. 28. Step 1 is the perfect North/South reflection of Step 1 in FIG. 21. Likewise, Step 2 in FIG. 29 is the perfect North/South reflection of Step 2 in FIG. 21, as is Step 3. Step 4 is trivially also the North/South reflection of Step 4 in FIG. 21. These steps combine to extend the wire shown in FIG. 28, just as Steps 1–4 in FIG. 21 extend the wire shown in FIG. 11.

U.S. Pat. No. 5,886,537 also describes additional configurations and organizations of cell matrix cells, including six-sided cells in both two- and three-dimensional arrangements. In these cases, the circuits and sequences described above can be easily modified to operate on these different topologies. The principals remain the same, only the specifics of their implementation on the cell matrix change.

Figure 30:
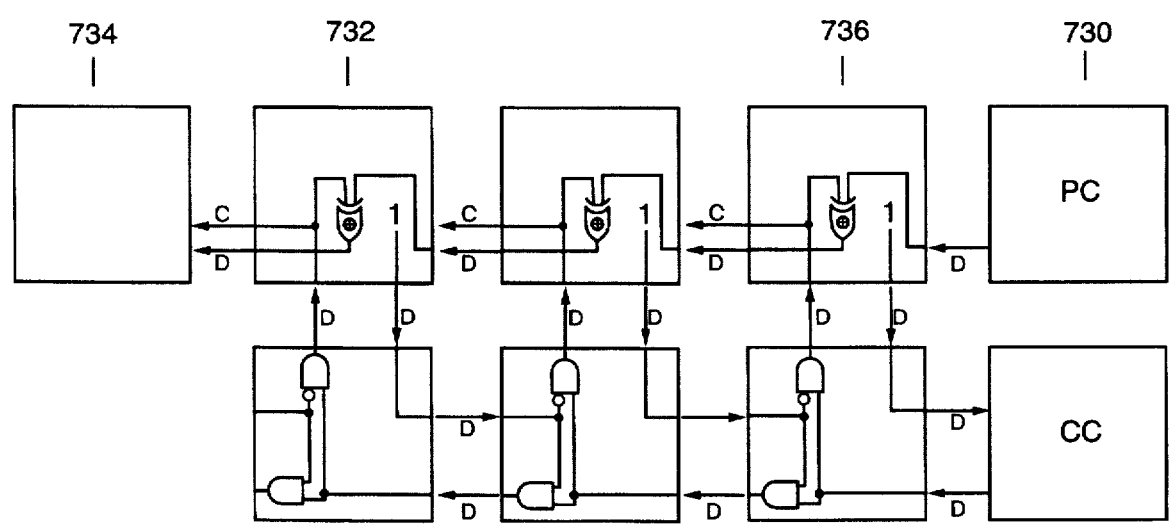
FIG. 30 illustrates yet another embodiment of a two-channel extendible wire.

FIG. 30 shows yet another variation on a basic two-channel wire. In this case, the cells along the PC have been modified by the inclusion on an exclusive-or gate. In the configuration shown, PC head cell 732 passes its DE input through an XOR gate along with its DS input. The result is, if the CC is transmitting 0, then cell 732 will pass the PC output from initial PC cell 730 to target cell 734's DE input. If, however, the CC is transmitting 1, then cell 732 will pass the inverse of the PC from initial PC cell 730 to target cell 734's DE input. The use of this wire is therefore the same as the two-channel wire shown in FIG. 11, except that to configure the target cell, the inverse of the desired bit pattern must be sent through the PC (this is an example of information transfer which is not a simple copying of input to output). This has the potential advantage that if, for example, cell 736 should fail, and head cell 732 only receives 0 on its DE input, the resulting configuration of target cell 734 would be all 1s instead of all 0. Since a truth table consisting of all 1s is much less common than a truth table consisting of all 0s, such a failure may be easier to detect in this wire than in the wire of FIG. 11.

Summary, Ramifications, and Scope

From the above descriptions, it can be seen that the configurations and sequences described therein are useful for gaining control over non-adjacent cells within a cell matrix. Such control is necessary in order for one set of cells to be able to synthesize useful circuits in a non-adjacent region of the matrix. Moreover, control of non-adjacent cells is necessary to bootstrap a cell matrix, given direct access to only a limited number of border cells.

Having such remote-access mechanisms available therefore allows the cell matrix to maintain its local-only interaction scheme, which is useful for fault tolerance, scalability and massively parallel configuration.

The configurations and sequences described above are building blocks, which are intended to be used together to achieve various types of remote access for different situations. For example, the steps described for configuring a single remote cell and for extending a wire can be combined repeatedly to configure a larger region of remote cells.

While the above descriptions contain many specificities, these should not be construed as limitations on the scope of the invention, but rather as exemplifications of two preferred embodiments thereof. Many other variations are possible. For example, there are numerous possible cell variations and cell interconnection topologies. The configurations and sequences described above work equally well on, for example, 6-sided three-dimensional cell matrices.

Furthermore, the configurations and sequences described above are applicable to a cell matrix in general, regardless of the specific implementation of the matrix. The cell matrix is an architecture, and as such, may be implemented in various technologies, which need not even be electrical in nature. Further details such as the specific ordering of bits within each cell's truth table memory, or the specifics of the system's clocking mechanism, are irrelevant to using these configurations and sequences.

Accordingly, the scope of the invention should be determined not by the embodiments illustrated, but by the appended claims and their legal equivalents.

What is claimed is:

1. A collection of self-dual processing cells, connected according to a regular interconnection topology to form a locally self-reconfigurable processing system, each of said cells possessing a configuration memory for specifying mappings from inputs to outputs, and each of said cells operating at any time in one of two modes, each of said cells having multiple sides, each of said sides having a C input for controlling the mode of said cell, and each of said sides also having a D input for exchanging information between said cell and other cells, said collection comprising:

(a) a cell, called a program channel head cell, including within its said configuration memory configuration data which causes information transfer from the D input of one side of said head cell, said side being called a connected input side, to the D output of one side of said head cell, said side being called a connected output side, said configuration data optionally specifying modification of said information transfer, said modification depending upon the value of one or more additional D inputs of said cell, said configuration memory also including configuration data which causes information transfer from the D input of another side of said cell, said side called a secondary connected input side, to the C output of said cell's said connected output side, said configuration data optionally specifying modification of said information transfer, said modification depending upon the value of one or more additional D inputs of said cell, (b) a first plurality of processing cells, called a program channel and including said program channel head cell, each cell of said program channel being adjacent to at least one other cell of said program channel according to said interconnection topology, each cell of said program channel including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said first plurality of cells situated within said locally self-reconfigurable processing system so that:

i) a first cell from said plurality, called an initial program channel cell, has its connected output side adjacent, according to said interconnection topology, to the connected input side of a second cell from said plurality if said plurality contains at least two cells, ii) said second cell's connected output side is adjacent, according to said interconnection topology, to the connected input side of a third cell from said plurality if said plurality contains at least three cells, iii) said third cell's connected output side is adjacent, according to said interconnection topology, to the connected input side of a fourth cell from said plurality if said plurality contains at least four cells, and so on, continuing to a last cell of said plurality, said last cell being said program channel head cell, said first plurality of cells thereby forming a bucket brigade assembly which transfers information from the D output of said initial program channel cell's connected output side through all cells of said plurality to the D output of said program channel head cell's connected output side, and (c) a second plurality of processing cells, called a control channel, each cell of said control channel being adjacent to at least one other cell of said control channel according to said interconnection topology, each cell of said control channel including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said second plurality of cells situated within said locally self-reconfigurable processing system so that:

i) a first cell from said plurality, called an initial control channel cell, has its connected output side adjacent, according to said interconnection topology, to the connected input side of a second cell from said plurality if said plurality contains at least two cells, ii) said second cell's connected output side is adjacent, according to said interconnection topology, to the connected input side of a third cell from said plurality if said plurality contains at least three cells, iii) said third cell's connected output side is adjacent, according to said interconnection topology, to the connected input side of a fourth cell from said plurality if said plurality contains at least four cells, and so on, continuing to a last cell of said plurality, called the control channel head cell, said second plurality of cells thereby forming a bucket brigade assembly which transfers information from the D output of said initial control channel cell's connected output side through all cells of said plurality to the D output of said control channel head cell's connected output side, said control channel head cell also being situated so that said control channel head cell's connected output side is adjacent, according to said interconnection topology, to said program channel head cell's secondary connected input side, whereby said initial control channel cell can control said program channel head cell's C output of said head cell's connected output side, and said initial program channel cell can control said program channel head cell's D output of said head cell's connected output side.

2. The collection of self-dual processing cells of claim 1, wherein each of zero or more of said cells of said control channel and each of zero or more of said cells of said program channel includes within its said configuration memory configuration data which causes additional information transfers from one or more D inputs of said cell to one or more C or D outputs of said cell, said configuration data optionally specifying modification of said information transfer, said modification depending upon the value of one or more additional D inputs of said cell.

3. The collection of self-dual processing cells of claim 2, wherein each of said cells of said control channel and each of said cells of said program channel includes within its said configuration memory configuration data which causes said information transfer from said D input of said cell's connected input side to be independent of the state of all other D inputs of said cell.

4. The collection of self-dual processing cells of claim 1, wherein each cell in said program channel also includes within its said configuration memory configuration data which causes information transfer from the D input from said cell's said connected output side to the D output of said cell's said connected input side, said configuration data optionally specifying modification of said information transfer, said modification depending upon the value of one or more additional D inputs of said cell, whereby said initial program channel cell is made to receive information from the D input of said program channel head cell's said connected output side.

5. The collection of self-dual processing cells of claim 4, wherein each of zero or more cells of said program channel also includes within its said configuration memory configuration data which causes additional information transfer from one or more D inputs of said cell to one or more C or D outputs of said cell, said configuration data optionally specifying modification of said information transfer, said modification depending upon the value of one or more additional D inputs of said cell.

6. The collection of self-dual processing cells of claim 5, wherein each cell of said program channel includes within its said configuration memory configuration data which causes said information transfer from said D input of said cell's connected output side to be independent of the state of all other D inputs of said cell.

7. The collection of self-dual processing cells of claim 1, further comprising:
   (a) additional pluralities of processing cells, each of said pluralities being called an auxiliary channel, each cell of said auxiliary channel being adjacent to at least one other cell of said auxiliary channel according to said interconnection topology, each cell of said auxiliary channel including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said plurality of cells situated within said locally self-reconfigurable processing system so that:
      i) a first cell from said plurality has its connected output side adjacent, according to said interconnection topology, to the connected input side of a second cell from said plurality if said plurality contains at least two cells,
      ii) said second cell's connected output side is adjacent, according to said interconnection topology, to the connected input side of a third cell from said plurality if said plurality contains at least three cells,
      iii) said third cell's connected output side is adjacent, according to said interconnection topology, to the connected input side of a fourth cell from said plurality if said plurality contains at least four cells,
      and so on, continuing to a last cell of said plurality, said plurality of cells thereby forming a bucket brigade assembly which transfers information from the D output of said first cell's connected output side through all cells of said plurality to the D output of said last cell's connected output side.

8. The collection of self-dual processing cells of claim 7, wherein each of zero or more of said cells of said auxiliary channel includes within its said configuration memory configuration data which causes additional information transfers from one or more D inputs of said cell to one or more C or D outputs of said cell, said information transfers optionally being conditionally modifiable by one or more additional D inputs of said cell.

9. The collection of self-dual processing cells of claim 8, wherein each cell of said auxiliary channel also includes within its said configuration memory configuration data which causes information transfer from the D input from said cell's said connected output side to the D output of said cell's said connected input side, said configuration data optionally specifying modification of said information transfer, said modification depending upon the value of one or more additional D inputs of said cell, whereby said first cell is made to receive information from the D input of said auxiliary channel's last cell's said connected output side.

10. The collection of self-dual processing cells of claim 9, wherein each of zero or more of said cells of said auxiliary channel includes within its said configuration memory configuration data which causes additional information transfers from one or more D inputs of said cell to one or more C or D outputs of said cell, said information transfers optionally being conditionally modifiable by one or more additional D inputs of said cell.

11. A collection of self-dual processing cells, connected according to a regular interconnection topology to form a locally self-reconfigurable processing system, each of said cells possessing a configuration memory for specifying mappings from inputs to outputs, and each of said cells operating at any time in one of two modes, each of said cells having multiple sides, each of said sides having a C input for controlling the mode of said cell, and each of said sides also having a D input for exchanging information between said cell and other cells, said collection comprising:
   (a) a first plurality of collections of processing cells, said plurality called a program channel, each of said collections of processing cells being called a PC segment, each said PC segment comprising:
      i) a cell called a signal PC cell, said cell including within its said configuration memory configuration data which causes:
         a) information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, and
         b) a logically true signal to be asserted on the D output of one side of said cell, said side being called a signal output side,
      ii) a cell called a control PC cell, which may be the same as said signal PC cell, said control PC cell including within its said configuration memory configuration data which causes:
         a) information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, and
         b) information transfer from the D input of one side of said cell, said side being called a secondary connected input side, to the C output of said cell's connected output side,
      iii) a collection of zero or more additional cells called intermediate PC cells, each cell of said collection including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell,
      said PC segment having its said cells situated within said locally self-reconfigurable processing system so that:
      ii) a first cell of said collection of zero or more intermediate PC cells, is said cell exists, has its said connected output side adjacent, according to said interconnection topology, to the connected input side of a second cell of said collection, if said collection comprises at least two cells,
      ii) a second cell of said collection, is said cell exists, has its said connected output side adjacent, according to said interconnection topology, to the connected input side of a third cell of said collection, if said collection comprises at least three cells,
      and so on, continuing to a last cell of said collection, said cells of said collection thereby forming a bucket brigade assembly which transfer information from the D input of said first cell's said connected input side through all cells of said collection to the D output of said last cell's said connected output side, and so that said signal PC cell has its said connected output side adjacent, according to said interconnection topology, to said connected input side of said first cell of said collection of zero or more intermediate PC cells, and said control PC cell has its said connected input side adjacent, according to said interconnection topology, to said connected output side of said last cell of said collection of zero or more intermediate PC cells, if said collection contains one or more cells, said signal PC cell instead having its connected output side adjacent, according to said interconnection topology, to said connected input side of said control PC cell if said collection of zero or more intermediate PC cells contains zero cells and said control PC cell is distinct from said signal PC cell, said signal PC cell otherwise being the only cell in said PC segment, said plurality of said PC segments and said cells within said segments being situated within said locally self-reconfigurable processing system so that:

i) a first PC segment from said plurality, called an initial PC segment, has its control PC cell's connected output side adjacent, according to said interconnection topology, to the connected input side of a signal PC cell of a second PC segment from said plurality if said plurality contains at least two PC segments, ii) a second PC segment from said plurality has its control PC cell's connected output side adjacent, according to said interconnection topology, to the connected input side of a signal PC cell of a third PC segment from said plurality if said plurality contains at least three PC segments, and so on, continuing to a last PC segment of said plurality, said plurality of PC segments thereby forming a bucket brigade assembly which transfers information from the D input of said connected input side of said signal PC cell of said first PC segment through all cells of all PC segments of said plurality to the D output of said connected output side of said control PC cell of said last PC segment, (b) a second plurality of collections of processing cells, said plurality called a control channel, each of said collections of processing cells called a CC segment, each said CC segment comprising:

i) a cell called a signal CC cell, said cell including within its said configuration memory configuration data which causes:

a) information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, and b) information transfer from the D input of one side of said cell, said side being called a signal input side, to the D output of one side of said cell, said side being called a feedback output side, said transfer optionally being conditionally modifiable by one or more additional D inputs of said cell, ii) a cell called a control CC cell, which may be the same as said signal CC cell, said control CC cell including within its said configuration memory configuration data which causes:

a) information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, and b) information transfer from the D input of said cell's said connected input side to the D output of one side of said cell, said side being celled a secondary connected output side, said information transfer being conditional upon the state of the D input on one side of said cell, said side being called a feedback input side, said transfer occurring only if said D input of said feedback input side is logically false, iii) a collection of zero or more additional cells called intermediate CC cells, each cell of said collection including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said CC segment having its said cells situated within said locally self-reconfigurable processing system so that:

i) a first cell of said collection of zero or more intermediate CC cells, is said cell exists, has its said connected output side adjacent, according to said interconnection topology, to the connected input side of a second cell of said collection, if said collection comprises at least two cells, ii) a second cell of said collection, is said cell exists, has its said connected output side adjacent, according to said interconnection topology, to the connected input side of a third cell of said collection, if said collection comprises at least three cells, and so on, continuing to a last cell of said collection, said cells of said collection thereby forming a bucket brigade assembly which transfers information from the D input of said first cell's said connected input side through all cells of said collection to the D output of said last cell's said connected output side, and so that said signal CC cell has its said connected output side adjacent, according to said interconnection topology, to said connected input side of said first cell of said collection of zero or more intermediate CC cells and said control CC cell has its said connected input side adjacent, according to said interconnection topology, to said connected output side of said last cell of said collection of zero or more intermediate CC cells, if said collection contains one or more cells, said signal CC cell instead having its said connected output side adjacent, according to said interconnection topology, to said connected input side of said control CC cell if said collection of zero or more intermediate CC cells contains zero cells and said control CC cell is distinct from said signal CC cell, said signal CC cell otherwise being the only cell in said CC segment, said plurality of said CC segments being situated within said locally self-reconfigurable processing system so that:

i) a first CC segment from said plurality, called an initial CC segment, has its control CC cell's connected output side adjacent, according to said interconnection topology, to the connected input side of the signal CC cell of a second CC segment from said plurality if said plurality contains at least two CC segments, said control CC cell's said feedback input side also being adjacent to said signal CC cell's said feedback output side, ii) a second CC segment from said plurality has its control CC cell's connected output side adjacent, according to said interconnection topology, to the connected input side of the signal CC cell of a third CC segment from said plurality if said plurality contains at least three CC segments, said control CC cell's said feedback input side also being adjacent to said signal CC cell's said feedback output side, and so on, continuing to a last CC segment of said plurality, said plurality of CC segments thereby forming a bucket brigade assembly which transfers information from the D input of said connected input side of said signal CC cell of said first CC segment through all cells of all CC segments of said plurality to the D output of said connected output side of said control CC cell of said last CC segment, said plurality of said CC segments and said cells of said segments also being situated within said locally self-reconfigurable processing system so that for each of said signal CC cells, said D input of said signal input side of said signal CC cell receives information from said D output of said signal output side of one of said signal PC cells, said information being transferred via zero or more cells called connecting cells, each of said connecting cells including within its configuration memory configuration data which causes information transfer from one of said cell's D inputs to one of said cell's D outputs, said connecting cells, if the number of said connecting cells is greater than zero, being situated within said locally self-reconfigurable processing system so that:

a) a first connecting cell receives information from said signal PC cell's said signal output side, b) a second connecting cell, if one exists, receives said information from a D output of said first connecting cell, and so, continuing to a last connecting cell, said last connecting cell transferring said information to said D input of said signal input side of said signal CC cell, said signal input side of said signal CC cell instead being adjacent, according to said interconnection topology, to said signal output side of one of said signal PC cells if said number of said connecting cells is zero, and so that for each of said control CC cells, said D output of said secondary connected output side of each of said control CC cells transfers information to said D input of said secondary connected input side of one of said control PC cells, said information being transferred via zero or more cells called connecting cells, each of said connecting cells including within its configuration memory configuration data which causes information transfer from one of said cell's D inputs to one of said cell's D outputs, said connecting cells, if the number of said connecting cells if greater than zero, being situated within said locally self-reconfigurable processing system so that:

a) a first connecting cell receives information from said control CC cell's said secondary connected output side, b) a second connecting cell, if one exists, receives said information from a D output of said first connecting cell, and so on, continuing to a last connecting cell, said last connecting cell transferring said information to said D input of said secondary connected input side of said control PC cell, said secondary connected output side of said control CC cell instead being adjacent, according to said interconnection topology, to said secondary connected input side of one of said control PC cells if said number of said connecting cells is zero, whereby said signal PC cell of said first PC segment of said program channel can control the D output of said connected output side of said control PC cell of said last PC segment of said program channel, and said signal CC cell of said first CC segment of said control channel can control the C output of said connected output side of said control PC cell of said last PC segment of said program channel if said D input of said feedback input side of said control CC cell of said last CC segment of said control channel is receiving a logically false signal.

12. The collection of self-dual processing cells of claim 11, wherein each of said control CC cells of each of said CC segments of said control channel includes within its said configuration memory configuration data which causes conditional information transfer from said D input of said cell's said connected input side to said D output of said cell's said connected output side, said conditional information transfer occurring only if said D input of said cell's said feedback input side is logically true.

13. The collection of self-dual processing cells of claim 11, wherein:

(a) number of said intermediate PC cells is zero, (b) number of said intermediate CC cells is zero, (c) number of said connecting cells between said signal PC cell and said signal CC cell is zero, (d) number of said connecting cells between said control PC cell and said control CC cell is zero, (e) said control PC cell is the same cell as said signal PC cell, and (f) said control CC cell is the same cell as said signal CC cell, whereby said collection of cells comprises exactly two cells, one cell being the only cell of said program channel, and the other cell being the only cell of said control channel.

14. The collection of self-dual processing cells of claim 11, wherein:

(a) each signal PC cell, intermediate PC cell, and control PC cell of each of said PC segments of said program channel additionally includes within its said configuration memory configuration data which causes information transfer from the D input of said cell's said connected output side to D output of said cell's said connected input side, said configuration data optionally specifying modification of said information transfer, said modification depending upon the value of one or more additional D inputs of said cell, whereby said signal PC cell of said first PC segment of said program channel will receive information from said control PC cell of said last PC segment of said program channel.

15. The collection of self-dual processing cells of claim 11, wherein each of said cells of each of said program channel segments of said program channel and each of said cells of each of said control channel segments of said control channel may additionally include within its said configuration memory configuration data which causes information transfer from one or more D inputs of said cell to one or more C or D outputs of said cell, said configuration data optionally specifying modification of said information transfer, said modification depending upon the value of one or more additional D inputs of said cell.

16. The collection of self-dual processing cells of claim 11, further comprising:
   (a) additional pluralities of processing cells, each of said pluralities being called an auxiliary channel, each cell of said auxiliary channel being adjacent to at least one other cell of said auxiliary channel according to said interconnection topology, each cell of said auxiliary channel including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said plurality of cells situated within said locally self-reconfigurable processing system so that:
      i) a first cell from said plurality has its connected output side adjacent, according to said interconnection topology, to the connected input side of a second cell from said plurality if said plurality contains at least two cells,
      ii) said second cell's connected output side is adjacent, according to said interconnection topology, to the connected input side of a third cell from said plurality if said plurality contains at least three cells,
      iii) said third cell's connected output side is adjacent, according to said interconnection topology, to the connected input side of a fourth cell from said plurality if said plurality contains at least four cells,
      and so on, continuing to a last cell of said plurality, said plurality of cells thereby forming a bucket brigade assembly which transfers information from the D output of said first cell's said connected output side through all cells of said plurality to the D output of said last cell's said connected output side.

17. The collection of self-dual processing cells of claim 16, wherein each of zero or more of said cells of said auxiliary channel includes within its said configuration memory configuration data which causes additional information transfers from one or more D inputs of said cell to one or more C or D outputs of said cell, said information transfers optionally being conditionally modifiable by one or more additional D inputs of said cell.

18. The collection of self-dual processing cells of claim 17, wherein
   (a) each cell of said auxiliary channel includes within its said configuration memory configuration data which causes information transfer from the D input of said cell's said connected output side to the D output of said cell's said connected input side, said configuration data optionally specifying modification of said information transfer, said modification depending upon the value of one or more additional D inputs of said cell,
   whereby said first cell of said auxiliary channel will receive information from said last cell of said auxiliary channel.

19. The collection of self-dual processing cells of claim 11, further comprising:
   (a) a plurality of processing cells, said plurality being called a break line, each cell of said break line being adjacent to at least one other cell of said break line according to said interconnection topology, each cell of said break line including within its said configuration memory configuration data which causes information transfer from the D input of one side of said cell, said side being called a connected input side, to the D output of one side of said cell, said side being called a connected output side, said configuration data optionally specifying modification of said information transfer, said modification depending upon the value of one or more additional D inputs of said cell, said plurality of cells situated within said locally self-reconfigurable processing system so that:
      i) a first cell from said plurality has its connected output side adjacent, according to said interconnection topology, to the connected input side of a second cell from said plurality if said plurality contains at least two cells,
      ii) said second cell's connected output side is adjacent, according to said interconnection topology, to the connected input side of a third cell from said plurality if said plurality contains at least three cells,
      iii) said third cell's connected output side is adjacent, according to said interconnection topology, to the connected input side of a fourth cell from said plurality if said plurality contains at least four cells,
      and so on, continuing to a last cell of said plurality, said plurality of cells thereby forming a bucket brigade assembly which transfers information from the D output of said first cell's connected output side through all cells of said plurality to the D output of said last cell's connected output side, and
   (b) a cell, called a break cell, including within its said configuration memory configuration data which causes information transfer from the D input of one side of said cell, said side being called a connected input side, to the C output of one side of said cell, said side being called a connected output side, said configuration data optionally specifying modification of said information transfer, said modification depending upon the value of one or more additional D inputs of said cell, said break cell situated within said locally self-reconfigurable processing system so that:
      i) said break cell's connected input side is adjacent, according to said interconnection topology, to said connected output side of said last cell of said break line, and
      ii) said beak cell's connected output side is adjacent, according to said interconnection topology, to one cell of said program channel or one cell of said control channel,
   whereby said first cell of said beak line can control one C input of said one cell of said program channel or said one cell of said control channel.

20. The collection of self-dual processing cells of claim 16, wherein:
   (a) said collection contains at least two of said auxiliary channels, and
   (b) at least one set of two of said auxiliary channels share a common cell,
   whereby said set of two auxiliary channels intersect each other.

21. The collection of self-dual processing cells of claim 11, wherein the orientation of said connected input side and said connected output side of each cell of said collection of self-dual processing cells is not the same for all of said cells, whereby the direction of information transfer is made to change along said channels.

22. The collection of self-dual processing cells of claim 11, wherein one or more of said connecting cells of said collection includes within its said configuration memory configuration data which causes information transfer from one or more additional D inputs of said cell to one or more additional D or C outputs of said cell.

23. In a collection of self-dual processing cells, said collection including a collection of cells configured to act as a two channel wire to provide remote access to and control of a cell called a target cell, said wire comprising:

(a) a cell called an initial PC cell, said cell configured and situated among other appropriately configured cells so that it has access, via its D output on one side, said side called its connected output side, to the D input on one side of said target cell, said side being called said target cell's connected input side, (b) a cell called an initial CC cell, said cell configured and situated among other appropriately configured cells so that it has access, via its D output on one side, said side called its connected output side, to the C input of said target cell's said connected input side, (c) a cell called a PC head cell, said cell being adjacent to said target cell and said cell configured to be able to control said target cell's said connected input side's D input via said PC head cell's D input on one of its sides, said side called its connected input side, and said PC head cell being able to control said target cell's said connected input side's C input via said PC head cell's D input on one of its sides, said side called its secondary connected input side, (d) a cell called a CC head cell, said cell configured and situated among other appropriately configured cells to be able to control said target cell's said connected input side's said C input via said CC head cell's D output on one of its sides, said side called its secondary connected output side, a method comprising the steps of:

(a) controlling the output value appearing on said D output of said initial CC cell's said connected output side for zero or more ticks of the system clock, the number and duration of said ticks being called a programming period, the pattern of said output values being called a CC bitstream, said CC bitstream chosen so as to cause said target cell's said C input to be set logically true or logically false throughout said programming period, and (b) simultaneously controlling the output value appearing on said D output of said initial PC cell's said connected output side for the same number of ticks of said system clock as said programming period, the pattern of said output values being called a PC bitstream, said PC bitstream chosen to correspond to desired configuration data to be loaded into said target cell's configuration memory, whereby said target cell's said C and D inputs are controlled via the cooperative actions of said initial PC cell and said initial CC cell.

24. The method of claim 23, wherein said cells of said two channel wire have been further configured to allow said initial PC cell to read information from the D output of said target cell's said connected input side, whereby said method causes said initial PC cell to read configuration data from said target cell's said configuration memory.

25. The method of claim 24, further comprising the step of using information read from said target cell's D output to affect said PC bitstream, whereby contents of said target cell's configuration memory can be read non-destructively.

26. The method of claim 23, wherein said PC bitstream and said CC bitstream are generated according to the steps:

(a) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:

ii) assert a logically true signal to the C output of one of said target cell's sides, said side being called a secondary output side, the cell being adjacent to said target cell on said side being called a secondary target cell, and ii) transfer information from said target cell's said connected input side to said target cell's said secondary output side, (b) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to cause said target cell's said D input to receive a desired bitstream, whereby the configuration memory within said secondary target cell is loaded with configuration data corresponding to said desired bitstream.

27. The method of claim 26, wherein said desired bitstream includes information which will cause said secondary target cell to pass information from one of its D inputs to one of its D outputs.

28. The method of claim 26, wherein said desired bitstream includes information which will cause said secondary target cell to pass information from one of its D inputs to one of its C outputs.

29. The method of claim 28, further comprising the subsequent step of causing said secondary target cell's said D input to be set to a logic value which causes said cell's said C output to be logically true, whereby said target cell is placed in C-mode via the action of said secondary target cell.

30. The method of claim 23, wherein said collection of cells configured to act as a two channel wire further comprises a means of preventing said CC head cell from asserting said D output of said secondary connected output side, said means controlled by the D input of one of said CC head cell's sides, said side called a feedback input side.

31. The method of claim 30, wherein said PC bitstream and said CC bitstream are generated according to the steps:

(a) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:

i) assert a logically true signal to the C output of one of said target cell's sides, said side being called a secondary connected input side, the cell being adjacent to said target cell on said side being called a secondary target cell, the side being shared by said target cell and said secondary target cell being called said secondary target cell's secondary connected output side, and ii) transfer information from the D input of said target cell's said connected input side to the D output of said target cell's said secondary connected input side, whereby said secondary target cell will subsequently be placed in C-mode and will receive new configuration data via said D input of said target cell's said connected input side, (b) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to deliver a specific bitstream to said secondary target cell, said bitstream corresponding to Boolean equations which will cause said secondary target cell to, among other possible functions:

i) transfer information from the D input of one side of said secondary target cell, said side called a connected input side, said side being adjacent to said CC head cell's said connected output side, to the D output of said secondary target cell's said secondary connected output side, said transfer optionally being conditionally modified by one or more additional D inputs to said secondary target cell, ii) transfer information from the D input of said connected input side to the D output of another side called a connected output side, said transfer optionally being conditionally modified by one or more additional D inputs to said secondary target cell, and iii) transfer information from the D input of said secondary target cell's said secondary connected output side to the D output of said secondary target cell's said connected input side, said transfer optionally being conditionally modified by one or more additional D inputs to said secondary target cell, (c) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:

i) assert a logically true signal to the D output of said target cell's said secondary connected input side, ii) transfer information from the D input of said target cell's said secondary connected input side to the C output of one side of said target cell, said side called a connected output side, and iii) transfer information from the D input of said target cell's said connected input side to the D output of said target cell's said connected output side, and (d) controlling the output value appearing on the D output of said initial CC cell's said connected output side to cause said target cell's said C input to be logically false, whereby said CC head cell will receive a signal via its said connected output side's D input which causes it to no longer pass information from its said connected input side to its said secondary connected output side, and whereby said target cell will function as a new PC head cell, and said secondary target cell will function as a new CC head cell.

32. The method of claim 23, wherein said PC bitstream and said CC bitstream are generated according to the steps:

(a) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream which includes information corresponding to Boolean equations which will:

i) assert a logically true signal to the C output of one of said target cell's sides, said side being called a secondary connected input side, the cell being adjacent to said target cell on said side being called a secondary target cell, and ii) assert a logically false signal to the D output of said target cell's said secondary connected input side, and (b) controlling the output value appearing on the D output of said initial CC cell's said connected output side to cause said target cell's said C input to be logically false for a sufficient number of clock ticks to cause said secondary target cell's configuration memory to be completely cleared.

33. The method of claim 23, wherein said PC bitstream and said CC bitstream are generated according to the steps:

(a) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:

i) assert a logically true signal to the C output of one of said target cell's sides, called its connected output side, ii) transfer information from the D input of said target cell's said connected input side to the D output of said target cell's said connected output side, whereby a cell, called a secondary target cell, which is adjacent to said target cell, will subsequently be placed into C-mode, (b) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:

i) assert a logically true signal to the C output of one of said secondary target cell's sides, said side called its connected output side, whereby a cell, called a tertiary target cell, which is adjacent to said secondary target cell, will subsequently be placed in C-mode and will have its configuration memory cleared, (c) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:
  i) assert a logically true signal to the C output of said target cell's said connected output side, and
  ii) transfer information from said target cell's said connected input side to said target cell's said connected output side, said connected output side being adjacent to a side of said secondary target cell, said side called its connected input side, whereby said secondary target cell will subsequently be placed into C-mode, (d) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:
  i) assert a logically true signal to the C output of said secondary target cell's said connected output side,
  ii) combine said secondary target cell's D input of its said connected input side with the D input of its said connected output side, said combination being a logical OR, with the result of said OR transmitted to the D output of said connected output side, whereby said tertiary target cell's configuration memory will be read and re-circulated back to said configuration memory, while being modified by said OR operation, (e) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:
  i) transfer information from said D input of said target cell's connected input side to said D output of said target cell's said connected output side, whereby information subsequently appearing on said D input will be transferred to said tertiary target cell's D input on a side where said tertiary cell's C input is also being asserted, said information being subject to said OR operation within said secondary target cell, (f) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to cause said target cell's said D input to receive a bitstream corresponding to a set of desired Boolean equations to be loaded into said tertiary cell's said configuration memory, (g) controlling the output value appearing on the D output of said initial CC cell's said connected output side to cause said target cell's said C input to be logically true for one or more clock ticks, while simultaneously controlling, during said clock ticks, the output value appearing on the D output of said initial PC cell's said connected output side to cause said target cell's said D input to receive a bitstream corresponding to Boolean equations which will, in addition to other possible functions:
  i) assert a logically true signal to the C output of said target cell's said connected output side, and
  ii) transfer information from said target cell's said connected input side to said target cell's said connected output side, whereby said secondary target cell will subsequently be placed into C-mode, and (h) controlling the output value appearing on the D output of said initial CC cell's said connected output side to cause said target cell's said C input to be logically false for one or more clock ticks, while simultaneously controlling, during said clock ticks, the output value appearing on the D output of said initial PC cell's said connected output side to cause said target cell's said D input to receive a bitstream corresponding to a set of desired Boolean equations, said equations including, among other possible functions, asserting a logically false signal to the C output of said secondary target cell's said connected output side, whereby said tertiary target cell will subsequently be returned to D-mode, whereby a set of desired Boolean equations is loaded into the configuration memory of said tertiary target cell.

* * * * *